US008754737B2

(12) United States Patent
Kin On Sin et al.

(10) Patent No.: US 8,754,737 B2
(45) Date of Patent: Jun. 17, 2014

(54) LARGE INDUCTANCE INTEGRATED MAGNETIC INDUCTION DEVICES AND METHODS OF FABRICATING THE SAME

(75) Inventors: Johnny Kin On Sin, Hong Kong (CN); Rongxiang Wu, Hong Kong (CN); Xiangming Fang, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 13/434,848

(22) Filed: Mar. 29, 2012

(65) Prior Publication Data

US 2012/0249282 A1 Oct. 4, 2012

Related U.S. Application Data

(60) Provisional application No. 61/457,447, filed on Mar. 30, 2011.

(51) Int. Cl.

| | |
|---|---|
| ***H01F 5/00*** | (2006.01) |
| ***H01F 27/28*** | (2006.01) |
| ***H01L 23/522*** | (2006.01) |
| ***H01F 17/00*** | (2006.01) |
| ***H01L 49/02*** | (2006.01) |

(52) U.S. Cl.

CPC ............ *H01L 28/10* (2013.01); *H01L 23/5227* (2013.01); *H01F 17/0033* (2013.01)

USPC ........... 336/200; 336/198; 336/220; 336/222; 336/195

(58) Field of Classification Search

USPC .......... 336/200, 198, 195, 220, 192, 173, 222

See application file for complete search history.

(56) References Cited

U.S. PATENT DOCUMENTS

| | | | | |
|---|---|---|---|---|
| 4,777,465 | A | 10/1988 | Meinel | |
| 6,236,538 | B1 * | 5/2001 | Yamada et al. | 360/123.6 |
| 6,249,039 | B1 * | 6/2001 | Harvey et al. | 257/531 |
| 6,429,764 | B1 | 8/2002 | Karam et al. | |
| 6,720,230 | B2 * | 4/2004 | Acosta et al. | 438/381 |
| 7,158,005 | B2 | 1/2007 | Pleskach et al. | |
| 7,196,607 | B2 | 3/2007 | Pleskach et al. | |

(Continued)

OTHER PUBLICATIONS

Sano et al., "A 2nd Generation Micro DC-DC Converter", vol. 53, No. 3, Fuji Electric Review, pp. 89-92, 2010.

Orlando et al., "Low-Resistance Integrated Toroidal Inductor for Power Management", IEEE Transactions on Magnetics, vol. 42, No. 10, Oct. 2006, pp. 3374-.

*Primary Examiner* — Elvin G Enad
*Assistant Examiner* — Kazi Hossain
(74) *Attorney, Agent, or Firm* — Amin, Turocy & Watson, LLP

(57) ABSTRACT

Methods and apparatus described herein are associated with integrated magnetic induction devices. A magnetic induction device can include a groove formed in a substrate, a magnetic core included in the groove and surrounded by a conductive winding that is adjacent to portion(s) of the substrate, and respective insulation layers included between the substrate and the conductive winding and between the magnetic core and the conductive winding. An inductor can further include conductive vias formed in the substrate and connected to respective portions of the conductive winding. Further, a transformer can include a groove formed in a substrate, a closed-loop/gapped magnetic core included in the groove and surrounded by first and second conductive windings that are adjacent to respective portions of the substrate, and respective insulation layers formed between the substrate and the first and second conductive windings, and between the closed-loop/gapped magnetic core and the first and second conductive windings.

24 Claims, 21 Drawing Sheets

(56) References Cited

U.S. PATENT DOCUMENTS

| | | | | |
|---|---|---|---|---|
| 7,489,222 | B2 | 2/2009 | Edo et al. | |
| 7,971,340 | B2 * | 7/2011 | Hebert et al. | 29/602.1 |
| 2002/0066175 | A1 * | 6/2002 | Huang et al. | 29/602.1 |
| 2004/0150939 | A1 * | 8/2004 | Huff | 361/277 |
| 2007/0085648 | A1 * | 4/2007 | Lee et al. | 336/200 |
| 2008/0100408 | A1 * | 5/2008 | Chen | 336/200 |
| 2008/0197963 | A1 * | 8/2008 | Muto | 336/200 |
| 2009/0201113 | A1 | 8/2009 | Crawford et al. | |
| 2011/0291785 | A1 * | 12/2011 | Lim et al. | 336/200 |

* cited by examiner 430
110
631
650
732
442
110
430
700

FIG. 11

LARGE INDUCTANCE INTEGRATED MAGNETIC INDUCTION DEVICES AND METHODS OF FABRICATING THE SAME

PRIORITY CLAIM

This application claims priority to U.S. Provisional Patent Application Ser. No. 61/457,447, filed on Mar. 30, 2011, entitled "LARGE INDUCTANCE INTEGRATED MAGNETIC INDUCTION DEVICE AND ITS METHOD OF FABRICATION THEREOF", the entirety of which is incorporated by reference herein.

TECHNICAL FIELD

This disclosure relates generally to inductive devices and fabricating methods including, but not limited to, large inductance integrated magnetic induction devices and related manufacturing methods.

BACKGROUND

Magnetic induction devices, including inductors and transformers, are widely used in power electronic applications such as switched mode power supplies. In these applications, large inductance, e.g., hundreds of μH, and small resistance magnetic induction devices can be used to achieve optimal circuit performance(s). Accordingly, such magnetic induction devices can utilize a magnetic core with a large cross sectional area that is surrounded by a large number of turns of thick conductive windings.

However, conventional induction device technologies do not enable monolithic circuit integration of large inductance magnetic devices.

The above-described deficiencies of today's techniques are merely intended to provide an overview of some of the problems of conventional devices, and are not intended to be exhaustive. Other problems with the state of the art and corresponding benefits of the various non-limiting embodiments described herein may become further apparent upon review of the following detailed description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

In accordance with one or more embodiments and corresponding disclosure, various non-limiting aspects are described in connection with providing monolithic circuit integration of large inductance magnetic devices.

For instance, an embodiment includes a magnetic induction device that includes a groove, e.g., a v-groove, a grove including a trapezoidal cross section, etc. that is formed in a substrate, e.g., a semiconductor body, a silicon wafer, a double-side-polished silicon wafer, etc. that can include other circuit components above and/or below the magnetic induction device. In various aspects, the groove can be formed in a bottom/top surface, layer, backside, etc. of the substrate. Further, the magnetic induction device can include a magnetic core included in the groove and surrounded by a conductive winding, e.g., solenoid, toroidal, copper, gold, metal composite material, etc. that is adjacent to portion(s) of the substrate. Furthermore, the magnetic induction device can include respective insulation layers included between the substrate and the conductive winding and between the magnetic core and the conductive winding.

In at least one embodiment, the magnetic induction device can include a conductive via formed in the substrate and connected to the conductive winding. In one embodiment, the conductive via can be connected to the conductive winding at an apex, peak, tip, etc. of the groove. In another embodiment, the conductive via can be connected to a conductive layer connected to the conductive winding at a base, bottom portion, etc. of the groove. In yet another embodiment, the conductive via can connect a portion of a top and/or bottom surface, layer, etc. of the substrate, e.g., which is connected to circuit component(s) above and/or below the magnetic induction device.

In at least one other embodiment, the respective insulation layers can include an insulation layer included, formed, etc. between the substrate and the conductive via. For example, the insulation layer can include a dielectric layer that covers a sidewall of the conductive via and/or a first dielectric layer formed, deposited, etc. on a side wall of the groove and/or a top/bottom surface of the substrate In one or more other embodiments, the conductive winding includes a conductive layer, e.g., a patterned layer, etc. that is formed, deposited, etc. on the first dielectric layer. In one embodiment, the respective insulation layers can include a second dielectric layer formed, deposited, etc. on the conductive layer. Further, the magnetic core can include a magnetic layer formed, deposited, etc. on the second dielectric layer. Furthermore, the magnetic induction device can include a third dielectric layer of the respective insulation layers that is formed, deposited, etc. on the magnetic layer, e.g., as a patterned dielectric layer.

Another non-limiting implementation can include an inductor that includes a groove, e.g., a v-groove, a groove including a trapezoidal cross section, etc. that is formed in a substrate, e.g., semiconductor body, silicon wafer, etc. Further, the inductor can include a magnetic core, e.g., a closed-loop magnetic core, a core including a gap between respective ends of the magnetic core, etc. that is included in the groove and surrounded by a conductive winding that is adjacent to portion(s) of the substrate. Furthermore, the inductor can include respective insulation layers included between the substrate and the conductive winding and between the magnetic core and the conductive winding. Moreover, the inductor can include conductive vias formed in the substrate and connected to respective portions of the conductive winding.

In one embodiment, a conductive via of the conductive vias can be connected to the conductive winding towards an apex of the groove, a bottom portion of the groove, etc. In another embodiment, the magnetic core can include a segment that is formed across from, adjacent to, etc. other segments, e.g., forming a meandering and/or winding path within the substrate.

Yet another non-limiting implementation can include a transformer, e.g., 2-phase, 3-phase, etc. that includes a groove formed in a substrate. Further, the transformer can include a closed-loop magnetic core included in the groove and surrounded by a first conductive winding and a second conductive winding that are adjacent to respective portions of the substrate, e.g., forming a 2-phase transformer. Furthermore, the transformer can include respective insulation layers formed between the substrate and the first conductive winding, between the substrate and the second conductive winding, between the closed-loop magnetic core and the first conductive winding, and between the closed-loop magnetic core and the second conductive winding.

In one or more non-limiting embodiments, the transformer can include a first conductive via formed in the substrate and connected to portion(s) of the first conductive winding; and a second conductive via formed in the substrate and connected to portion(s) of the second conductive winding. In one embodiment, portion(s) of the first conductive winding can be interleaved with portion(s) of the second conductive winding. In another embodiment, the transformer can include a third conductive winding that is adjacent to a portion of the substrate, e.g., forming a 3-phase transformer. Further, the transformer can include other respective insulation layers formed between the substrate and the third conductive winding and between the closed-loop magnetic core and the third conductive winding.

One or more other non-limiting implementations can include forming a groove, e.g., a v-groove, a groove including a trapezoidal, etc. in a substrate from a surface of the substrate. In one embodiment, the groove can be formed by chemical etching of the substrate, crystal orientation dependent chemical etching of the substrate, lateral-based plasma etching, etc. Further, such non-limiting implementations can include forming, depositing, etc. a first dielectric layer on respective side walls of the groove and the surface of the substrate; forming, depositing, etc. a conductive layer on the first dielectric layer; forming a second dielectric layer on the conductive layer; forming a magnetic layer on the second dielectric layer; and forming a third dielectric layer on the magnetic layer.

In one or more non-limiting embodiments, such dielectric layers can be formed by chemical vapor deposition, sputtering, thermal oxidation, etc. In one or more embodiments, the conductive layer and/or the magnetic layer can be formed by deposition of a seed layer of conductive material, followed by electrochemical deposition, chemical vapor deposition, sputtering, thermal spray, etc.

In one or more embodiments, hole(s) can be formed in the substrate from a surface of the substrate, e.g., by plasma etching. Further, dielectric layers can be formed on respective surfaces of the hole(s) and conductive layers can be formed on such dielectric layers to form conductive via(s).

One or more other embodiments can include removing respective portions of the first dielectric layer, the second dielectric layer, the third dielectric layer, the conductive layer, and/or the magnetic layer; and forming conductive layers on portions of the respective portions that are adjacent to the conductive layer to create respective contacts. For example, such removing can be performed by planarization, lithography, etching, etc.

Other embodiments and various non-limiting examples, scenarios, and implementations are described in more detail below.

BRIEF DESCRIPTION OF THE DRAWINGS

Various non-limiting embodiments are further described with reference to the accompanying drawings in which:

FIGS. 9-11 illustrate schematic 3-D views of respective magnetic induction devices, in accordance with various embodiments.

DETAILED DESCRIPTION

Overview

Figure 1:
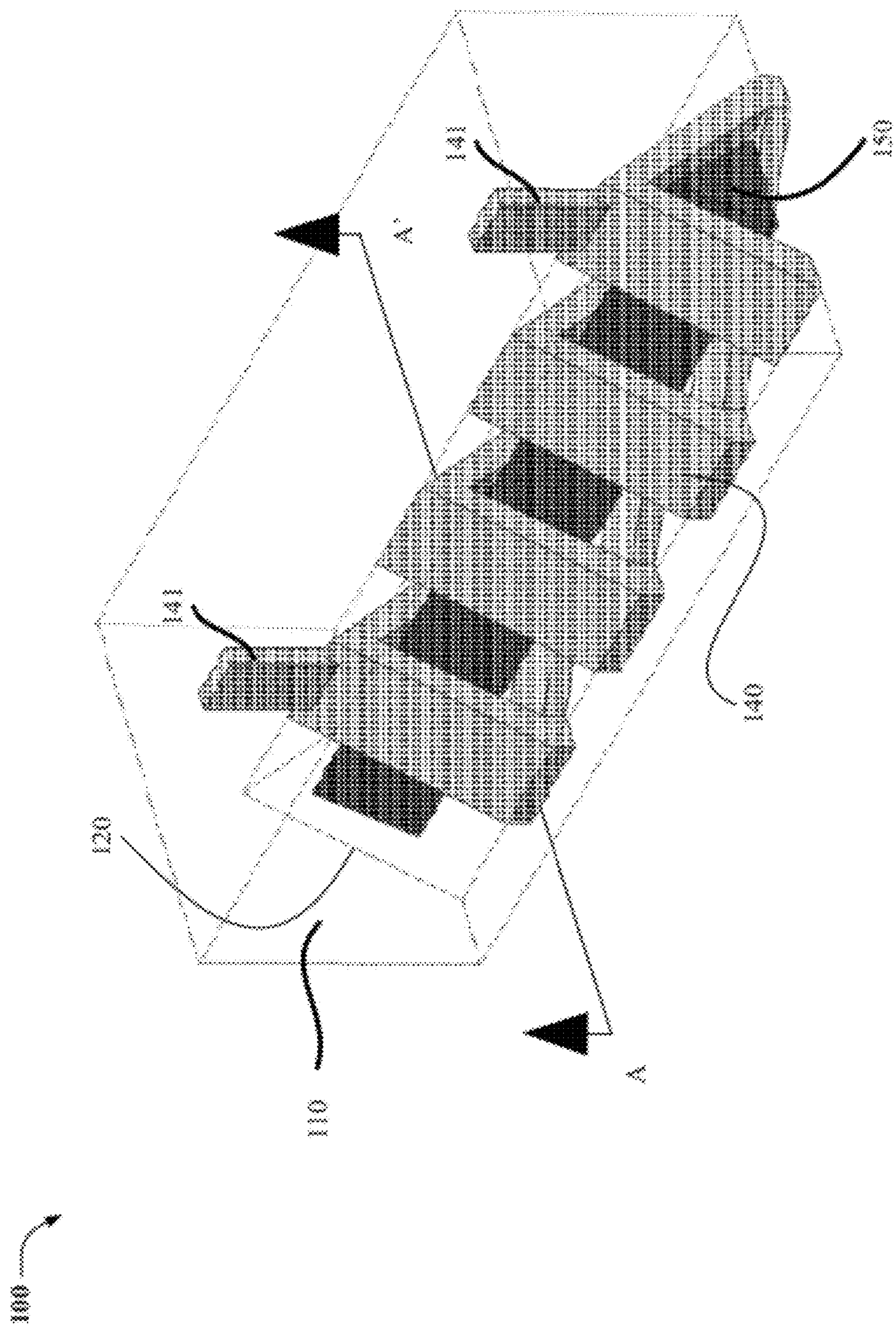
FIG. 1 illustrates a schematic 3-dimensional (3-D) view of a magnetic induction device, in accordance with an embodiment.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular environment or standard. In other instances, well-known structures and devices are shown in block diagram form in order to facilitate describing the embodiments in additional detail.

Various non-limiting embodiments of methods and apparatus presented herein provide for integrated magnetic induction devices that can operate with small resistance and large inductance values within a small device area of a monolithic integrated circuit.

In one embodiment, a magnetic induction device comprises a groove formed in a substrate; a magnetic core included in the groove and surrounded by a conductive winding that is adjacent to at least a portion of the substrate; and respective insulation layers included between the substrate and the conductive winding and between the magnetic core and the conductive winding.

In another embodiment, an inductor comprises a groove formed in a substrate; a magnetic core included in the groove and surrounded by a conductive winding that is adjacent to at least a portion of the substrate; respective insulation layers included between the substrate and the conductive winding and between the magnetic core and the conductive winding; and conductive vias formed in the substrate and connected to respective portions of the conductive winding.

In yet another embodiment, a transformer comprises a groove formed in a substrate; a closed-loop/gapped magnetic core included in the groove and surrounded by a first conductive winding and a second conductive winding that are adjacent to respective portions of the substrate; and respective insulation layers formed between the substrate and the first conductive winding, between the substrate and the second conductive winding, between the closed-loop/gapped magnetic core and the first conductive winding, and between the closed-loop/gapped magnetic core and the second conductive winding.

In an embodiment, a method comprises forming a groove in a substrate from a first surface of the substrate; forming a first dielectric layer on respective side walls of the groove and the first surface of the substrate; forming a conductive layer on the first dielectric layer; forming a second dielectric layer on the conductive layer; forming a magnetic layer on the second dielectric layer; and forming a third dielectric layer on the magnetic layer.

Such techniques enable efficient integration of magnetic devices with large inductance and small resistance values into monolithic integrated circuits.

Figure 2:
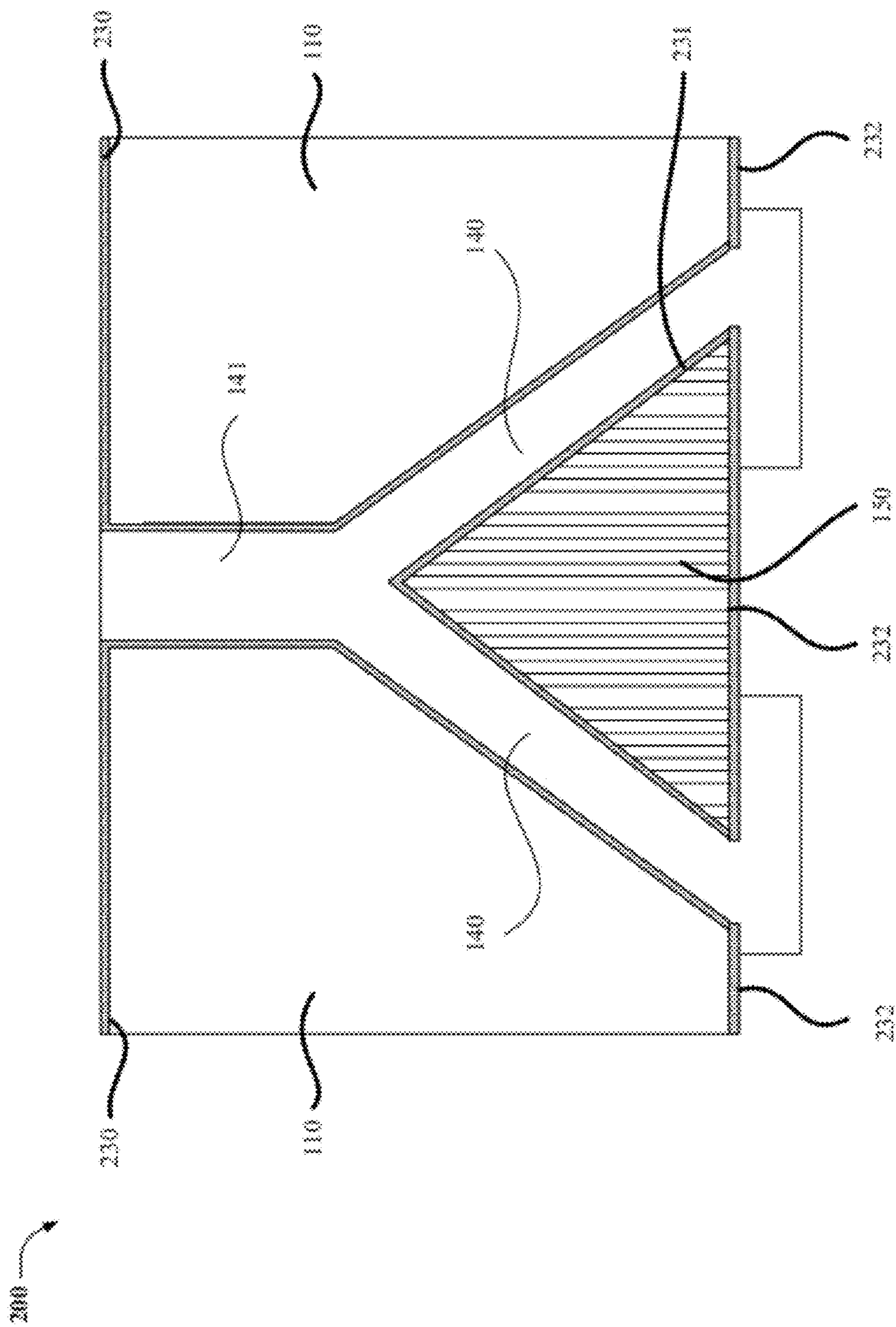
FIGS. 2-8 illustrate cross-sectional views of respective magnetic induction devices, in accordance with various embodiments.
Figure 3:
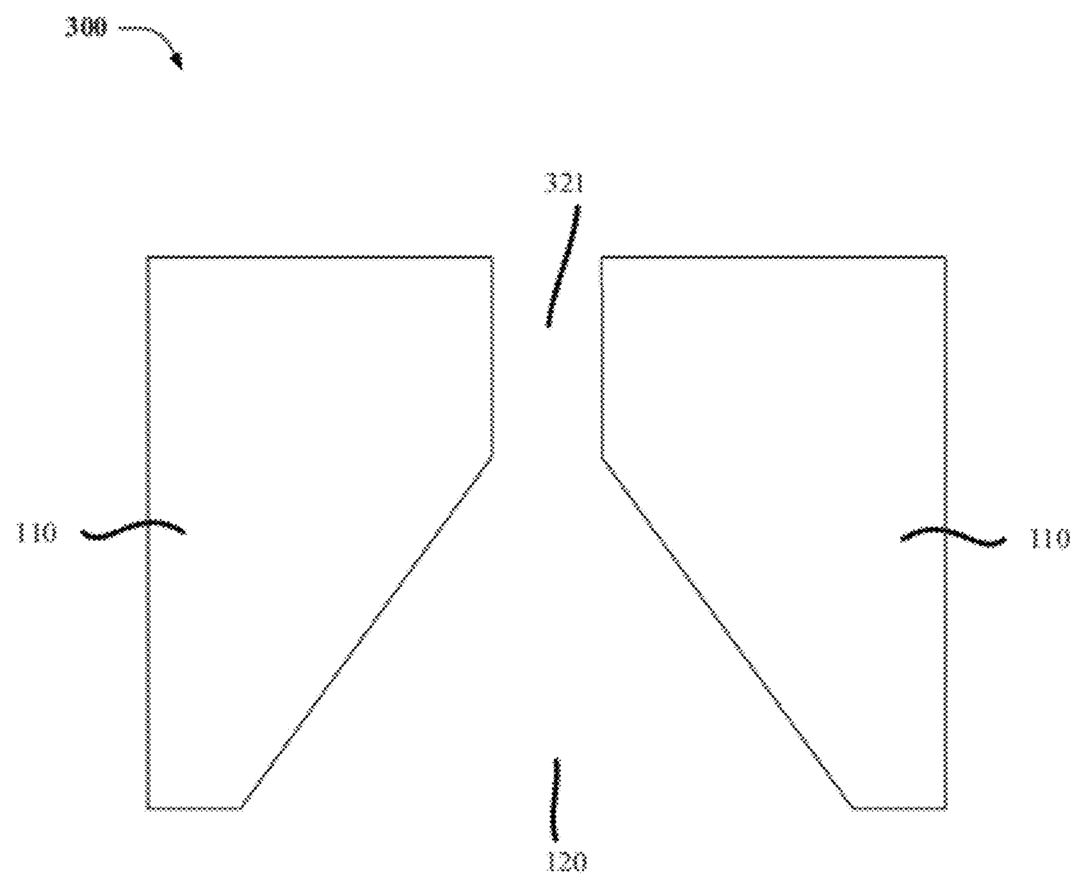
Figure 4:
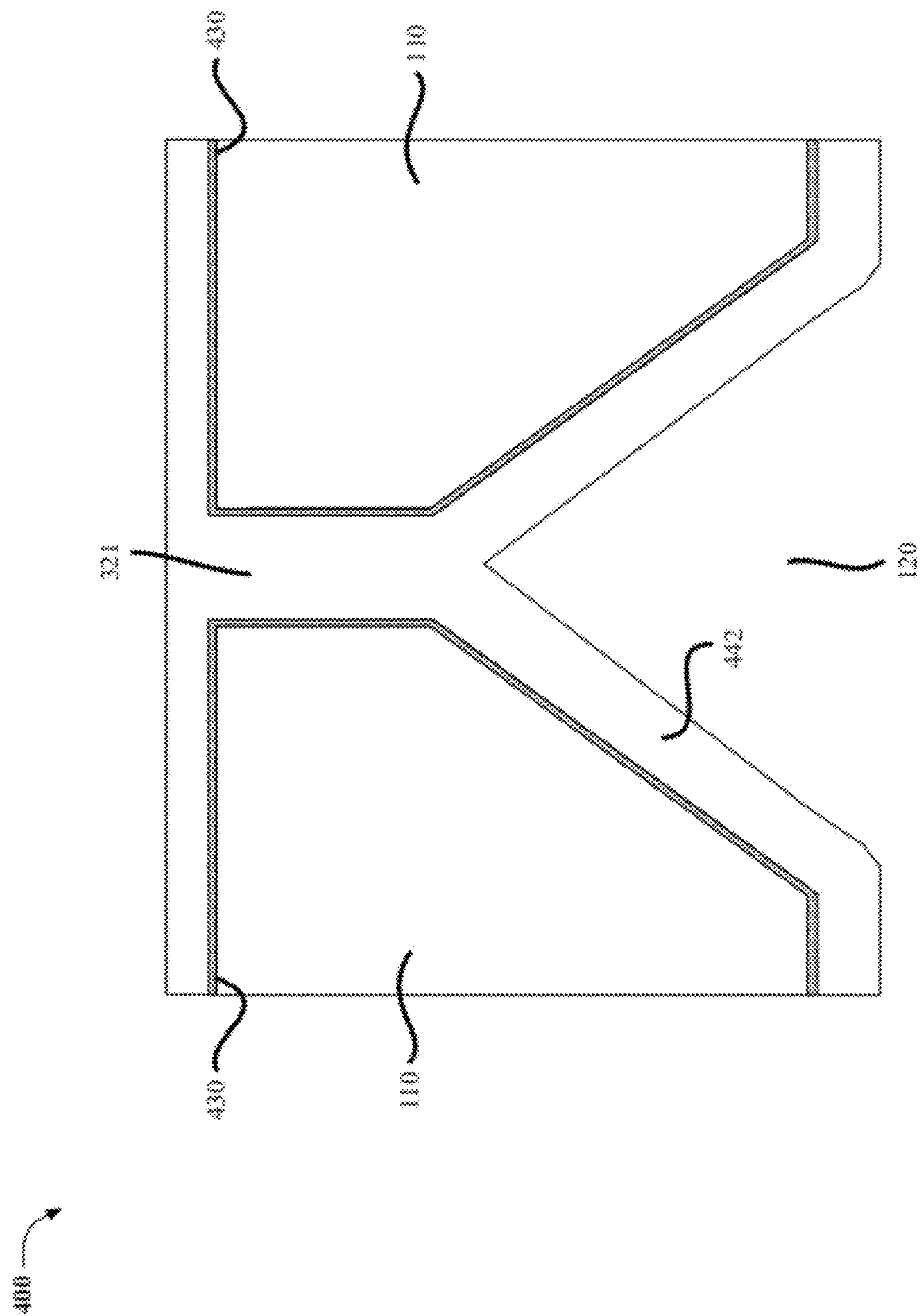

Large Inductance Integrated Magnetic Induction Devices and Related Manufacturing Methods FIG. 1 illustrates a schematic 3-D view of a magnetic induction device 100; and FIG. 2 illustrates a cross-sectional view 200 of magnetic induction device 100 along line AA' of FIG. 1. In one embodiment, magnetic core 150 can be included, placed, formed, etc. inside a V-groove 120 formed in substrate 110, e.g., a semiconductor body, a silicon wafer, a double-side-polished silicon wafer, etc. that can include other circuit components (not shown) above and/or below magnetic induction device 100. Such circuit components can be included, for example, in applications including a power management system, a system on chip (SOC) system, an AC/DC converter, a DC/AC converter, a power converter, e.g., with an input voltage larger than 12 V such as a mains AC supply voltage of 220V, a power transistor gate driver, an isolator used for control signal feedback, a transformer, power factor correction for restoring a wave shape of an input, etc.

As illustrated by FIG. 1, V-groove 120 can be formed in a bottom surface, layer, backside, etc. of substrate 110. In another embodiment, V-groove 120 can be formed in a top surface, layer, etc. of substrate 110. In one embodiment, V-groove 120 can be formed by chemical etching of substrate 110, orientation dependent chemical etching of substrate 110, plasma etching method(s) with lateral etching capability, crystal orientation dependent chemical etching of substrate 110 such as tetramethylammonium hydroxide (TMAH) etching of substrate 110, anisotropic etching of silicon at a backside of substrate 100, etc. As such, magnetic induction device 100 can be effectively integrated with other circuit components (not shown), for example, of an SOC system, etc. (see above) that can be fabricated in a top surface layer of substrate 110.

A depth of V-groove 120 can be large, e.g., 400 μm, which can provide a large space for (1) placing, forming, etc. conductive winding 140, e.g., patterned as thick windings (e.g., 100 μm) within side wall(s) of V-groove 120 and (2) including, placing, forming, etc. magnetic core material 150, e.g., having a large core cross-sectional area (e.g., 20,000 $\mu m^2$), for example, associated with a large inductance value. Accordingly, advantages of various embodiments disclosed herein include providing a magnetic core with a large cross sectional area and providing a large number of winding turns, a small winding length for each turn and very thick conductive windings—providing compact, integrated magnetic device structures having respective large inductance values, small resistance values, and small device areas.

In one or more embodiments, magnetic core 150 can be included, placed, formed, etc. inside V-groove 120 by physical deposition of a seed layer and electro-chemical deposition of a magnetic core material, e.g., an alloy material composed of Co, Ni, and Fe, or any other physical/chemical deposition methods. Further, magnetic core 150 can be surrounded by conductive winding 140, e.g., a solenoid conductive winding, a toroidal conductive winding, etc. that is adjacent to portion(s) of substrate 110, e.g., along respective side walls of V-groove 120. Further, and now referring to FIG. 2, magnetic induction device 100 can include respective insulation layers, e.g., 231, 232, etc. included between substrate 110 and conductive winding 140 and between magnetic core 150 and conductive winding 140.

In one or more aspects, the respective insulation layers can be formed by deposition of dielectric material(s) such as chemical vapor deposition (CVD) of silicon oxide with silane or tetraethyl orthosilicate (TEOS) as a source gas, thermal oxidation, etc. Further, one or more embodiments can include patterning of the respective insulation layers via masked chemical etching, e.g. buffered oxide etchant (BOE) wet etching of silicon oxide, plasma etching, etc.

In one aspect, conductive winding 140 can be formed by chemical vapor deposition, sputtering, etc. of conductive layers on surface(s) of substrate 100, along insulation layers adjacent to side walls of V-groove 120, and along insulation layers adjacent to holes (see 321 below). For example, the conductive layers can be formed by physical deposition of a seed layer, followed by electro-chemical deposition, e.g., of Al or Cu, or any other physical/chemical deposition methods. Further, patterning of the conductive layers on the side walls of V-groove 120 can be performed to generate portion(s) of conductive winding 140. Such patterning can be implemented by masked chemical etching, e.g., $FeCl_3$ wet etching of Cu or $HPO_4$, $CH_3COOH$ and $HNO_3$ wet etching of Al, plasma etching, etc.

Magnetic induction device 100 can be fabricated in a bottom layer of substrate 110 and connected to a top side of substrate 110 by conductive via 141, providing for monolithic integration, for example, since a large portion of a top surface of substrate 110 can be used for other circuit components of associated system(s) as described above. Conductive via 141 can be connected to conductive winding 140 at top and/or bottom portion(s) of substrate 110, and to portion(s) of top/bottom surface(s), layer(s), etc. of substrate 110, e.g., which can be connected to circuit component(s) above and/or below magnetic induction device 100. In one embodiment, conductive via 141 can connect to conductive winding 140 at an apex, tip, peak, etc. of V-groove 120. In other embodiment, conductive via 141 can connect to conductive layer(s) connected to conductive winding 140 at a base, bottom portion, etc. of V-groove 120 (see, e.g., FIG. 9 and related discussion below). Further, as illustrated by FIG. 2, conductive winding 140 and conductive via 141 can be isolated with substrate 110 and magnetic core 150 by respective insulation layers, e.g., 230-232.

In one or more embodiments, and now referring to FIGS. 3-8, substrate 110 can include hole 321 that can be formed by plasma etching, e.g., deep reactive ion etching (DRIE) of substrate 110, from one or more sides of substrate 110. Further, the depth of V-groove 120 can vary, in some aspects, between 50 μm to 500 μm, e.g., based on the thickness of substrate 110 and specific device design objectives. Furthermore, the width of V-groove 120 can vary, in one or more aspects, from one half of the depth of V-groove 120 to five times the depth of V-groove 120.

Additionally, the respective insulation layers, e.g., 230-232, can include a first dielectric layer 430 formed, deposited, etc. on side walls of V-groove 120 and hole 321 and on surface(s) of substrate 110. Further, conductive layer 442, e.g., patterned conductive layer, etc. can be formed, deposited, etc. on dielectric layer 430, e.g., covering side walls of V-groove 120 and filling hole 321. In one or more aspects, dielectric layer 430 can be formed by deposition, e.g. chemical vapor deposition of silicon oxide with silane or TEOS as the source gas, or chemical reaction, e.g. oxidation of substrate 110. Furthermore, conductive layer 442 can be formed by deposition of a seed layer of conductive material, e.g., sputtering of TaN/Cu, followed by electrochemical deposition, e.g. electroplating of Cu. Conductive layer 442 can also be formed by direct deposition, e.g. sputtering of Al or Cu. In one more aspects, a thickness of conductive layer 442 can range from 0.5 μm to 100 μm, e.g., based on resistance requirement(s) of a specific application.

Figure 5:
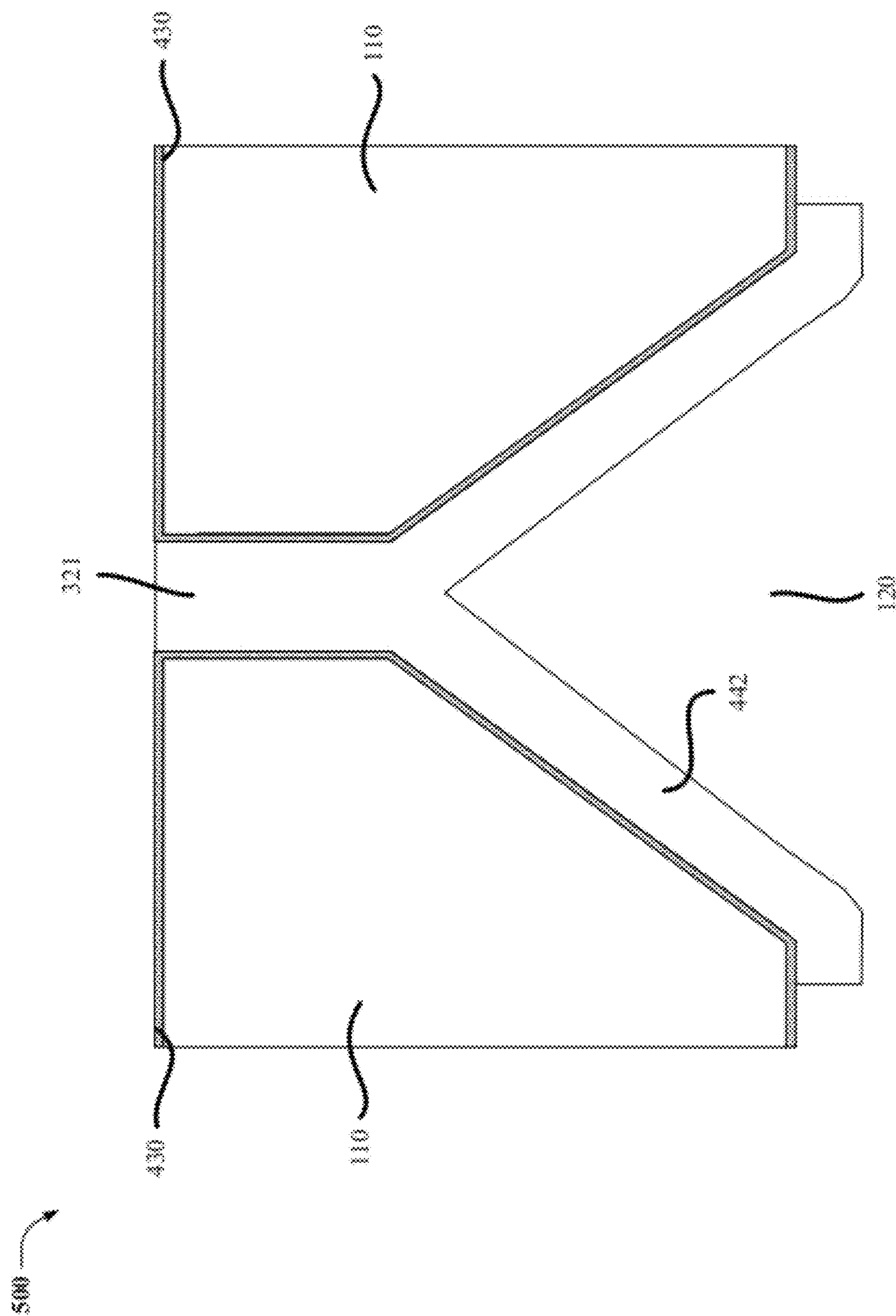
Figure 6:
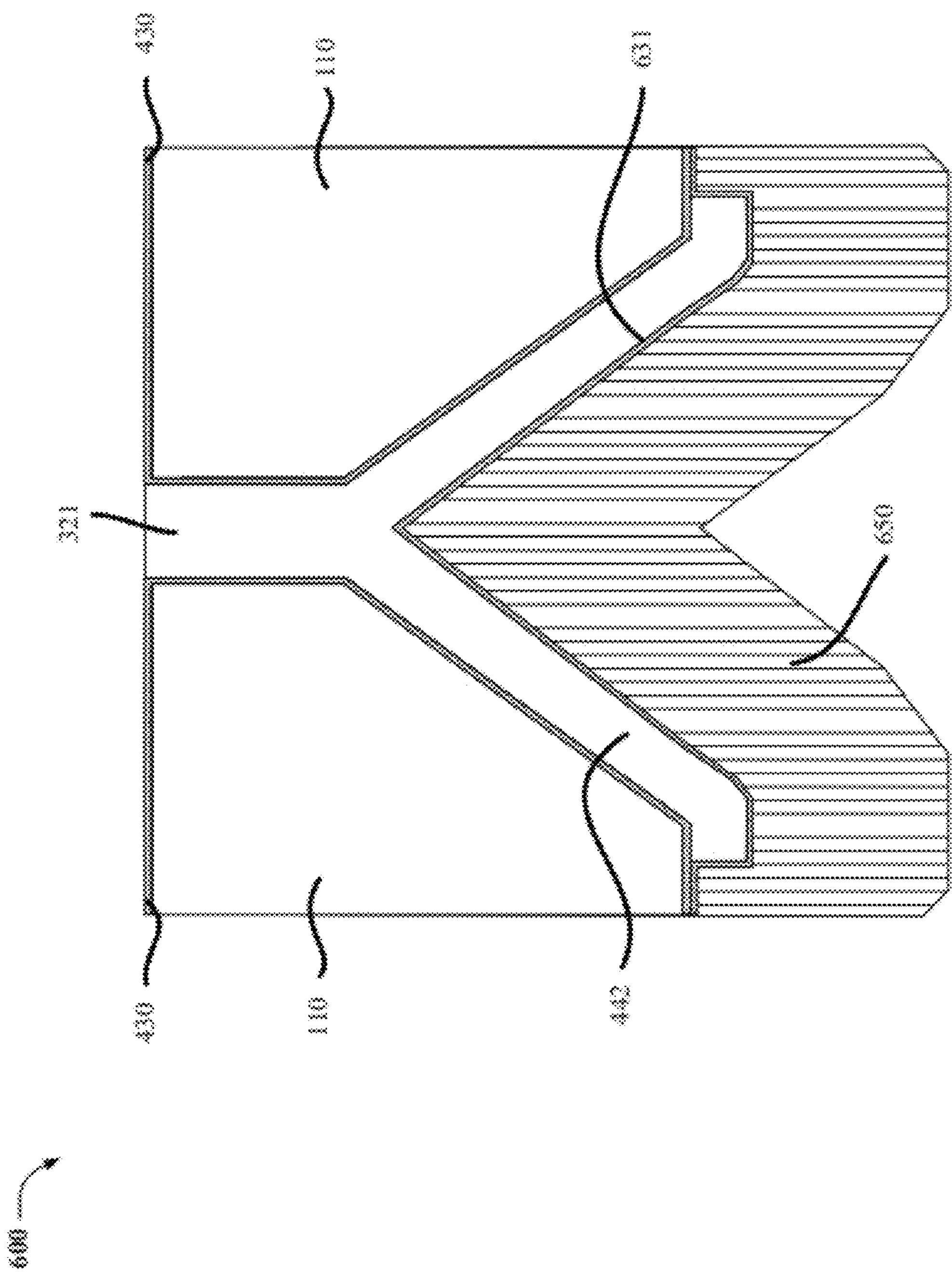

Referring now to FIGS. 5 and 6, portions of conductive layer 442 over the surface of substrate 110 at opposite sides of the V-groove 120 can be removed, e.g., by a planarization process, e.g., chemical mechanical polishing. Further, conductive layer 442 can be patterned, e.g., via lithography, etching, etc. on the side walls of V-groove 120 and over the surface of the substrate 110. Furthermore, dielectric layer 631 can be formed, deposited, etc. on conductive layer 442, e.g., by deposition, e.g., chemical vapor deposition of silicon oxide with silane or TEOS as the source gas, chemical reaction, e.g. oxidation of conductive layer 442, etc. Additionally, magnetic layer 650 can be formed on dielectric layer 631 and fill V-groove 120. For example, magnetic layer 650 can be formed by deposition of a seed layer of conductive material, followed by electrochemical deposition of magnetic layer 650, e.g., by electroplating of Ni, Co, Fe alloys, etc. In other embodiment(s), magnetic layer 650 can be formed by direct deposition, e.g., sputtering, etc. In one or more aspects, a thickness of magnetic layer 650 can range from 5 μm to 500 μm, e.g., based on dimensions of V-groove 120 and the thickness of the conductive layer 442.

Figure 7:
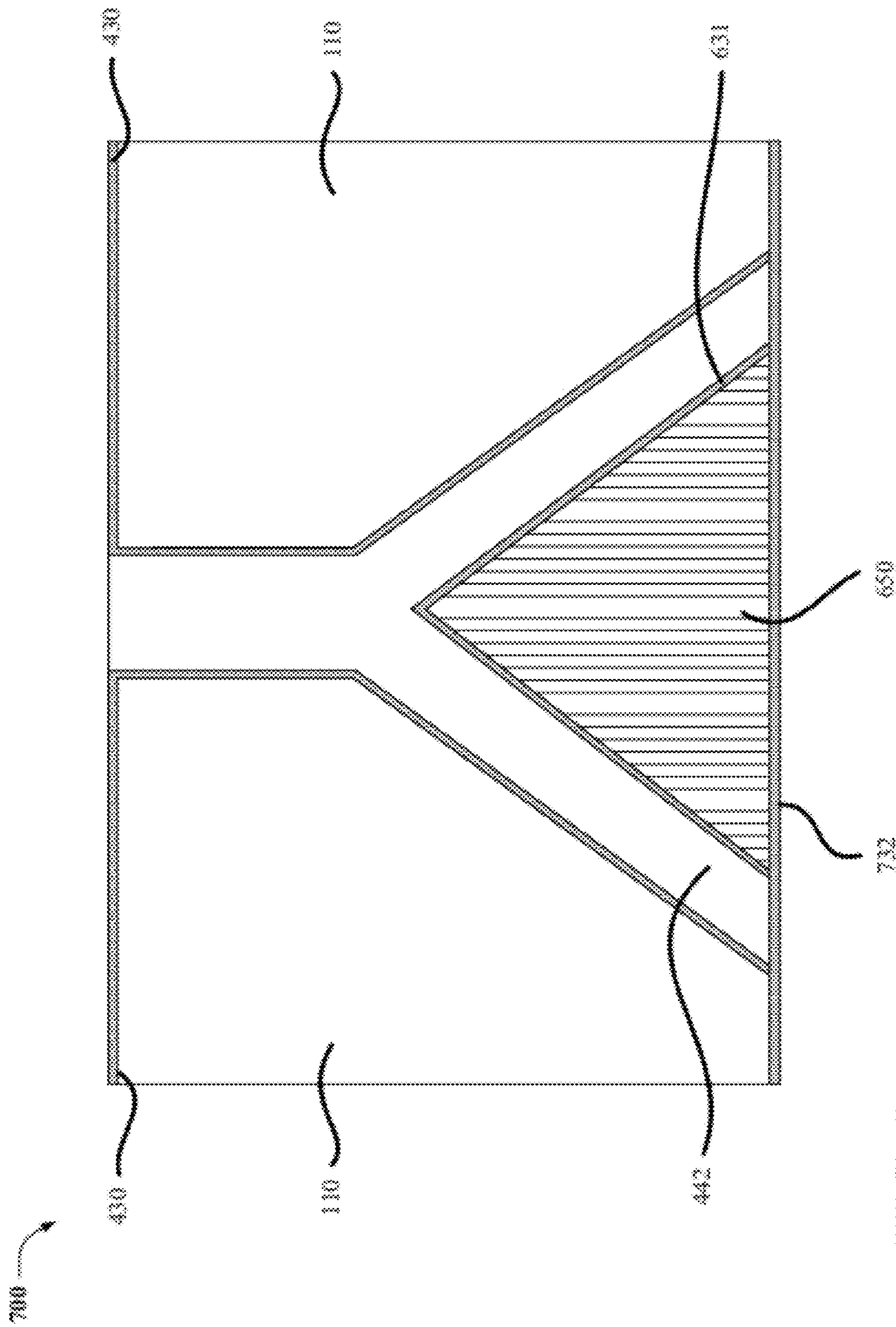

As illustrated by FIG. 7, portions of magnetic layer 650 over the surface of substrate 110, and portions of conductive layer 442 can be removed, e.g., at respective sides of V-groove 120. The portions of magnetic layer 650 and conductive layer 442 can be removed by a planarization process, e.g. polishing. Further, dielectric layer 732 can be formed, deposited, etc. at a surface aligned with such portions, for example, covering a surface of magnetic layer 650 remaining in V-groove 120. In one or aspects, dielectric layer 732 can be formed by deposition, e.g. chemical vapor deposition of silicon oxide with silane or TEOS as the source gas, chemical reaction, e.g. oxidation of magnetic layer 650, etc.

Figure 8:
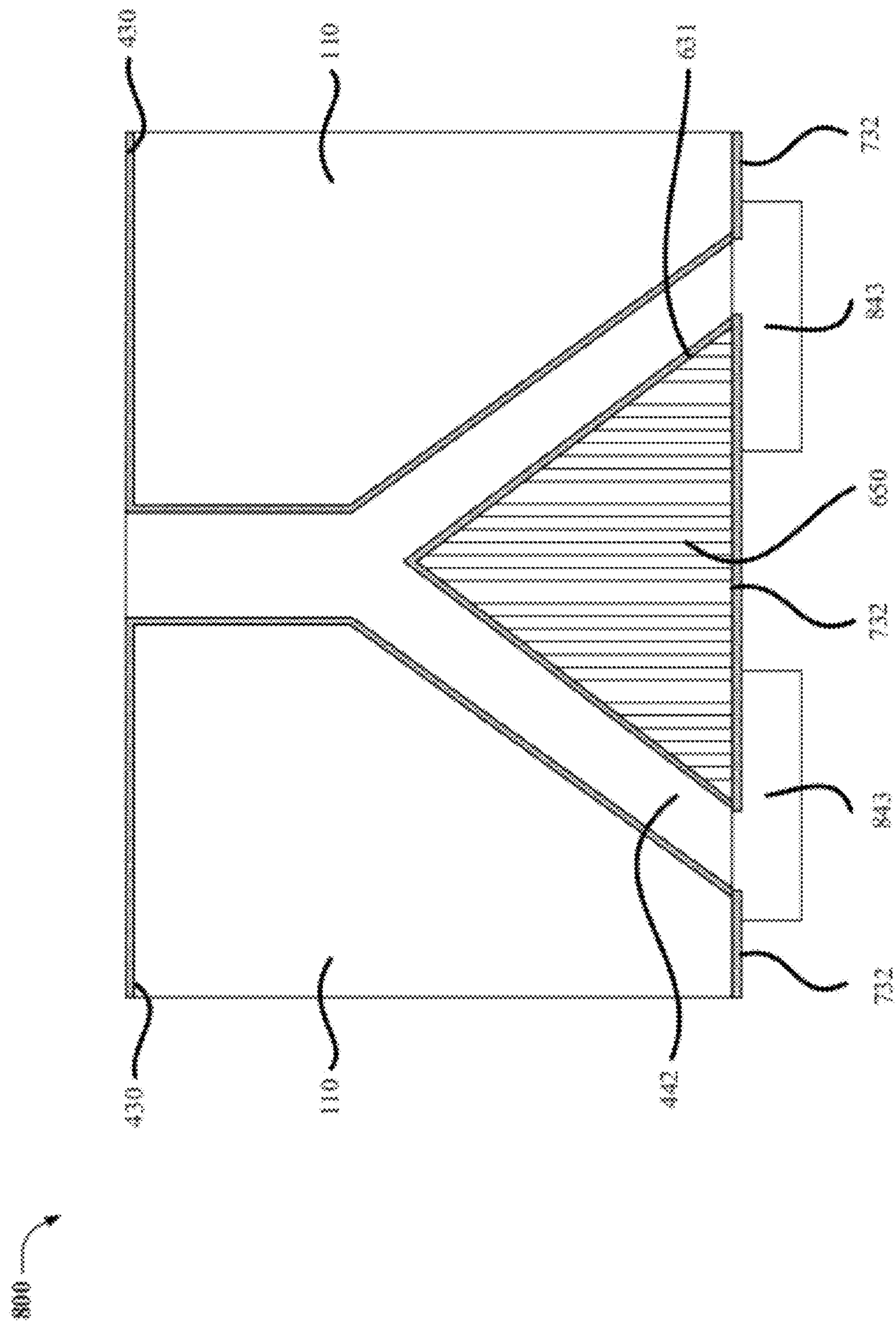

Now referring to FIG. 8, dielectric layers 732 and/or 430 can be patterned/selectively removed by lithography and/or etching. Further, conductive layer 843 can be formed by patterning, e.g., by lithograpy or etching, or formed by deposition of a seed layer of conductive material, e.g. sputtering of TaN/Cu, followed by electrochemical deposition, e.g. electroplating of Cu. Furthermore, conductive layer 843 can be formed by direct deposition, e.g., sputtering of Al or Cu. In one or more aspects, a thickness of conductive layer 843 can range from 0.5 μm to 100 μm, based on resistance requirement(s) of a specific application.

Figure 9:
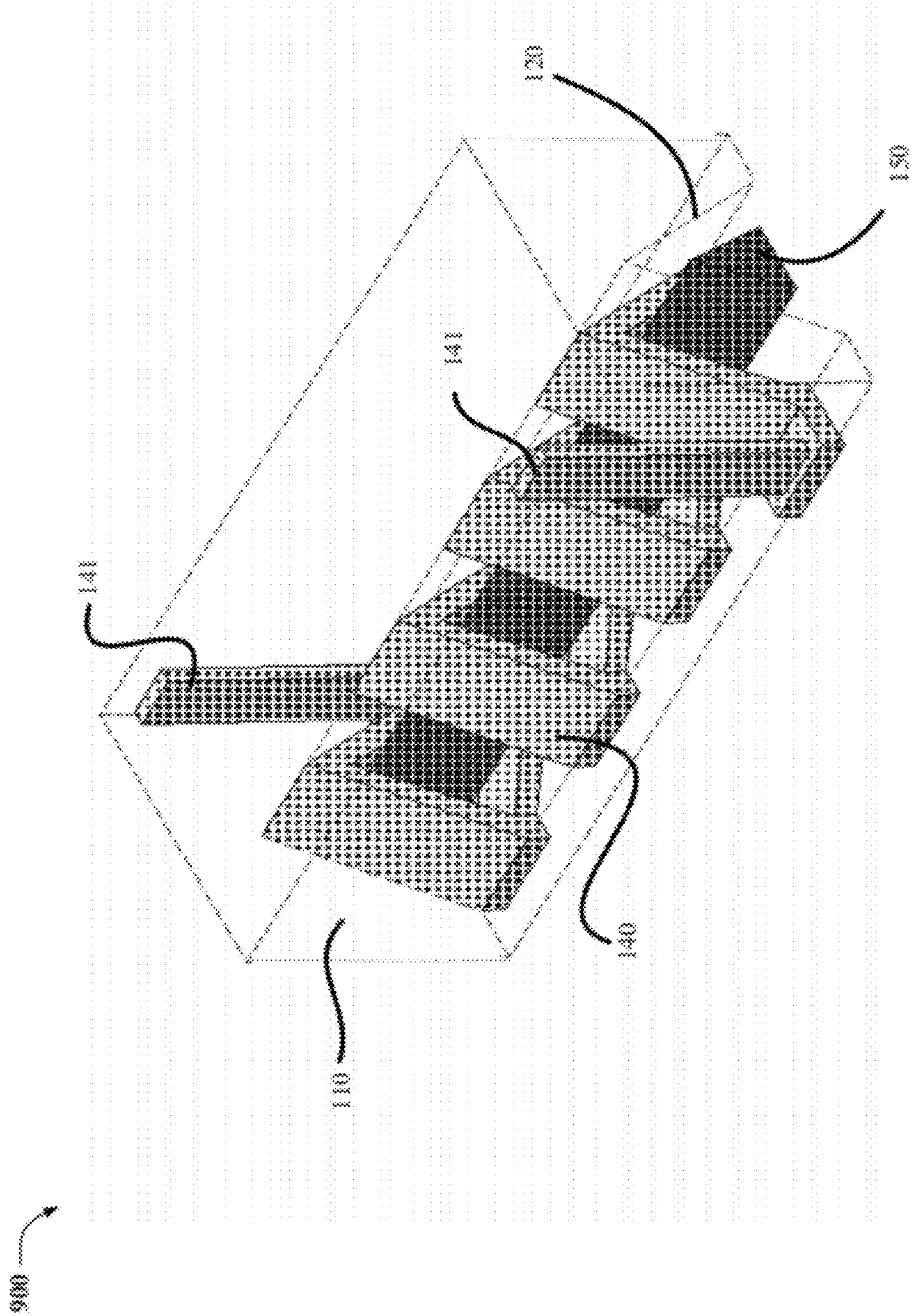
Figure 10:
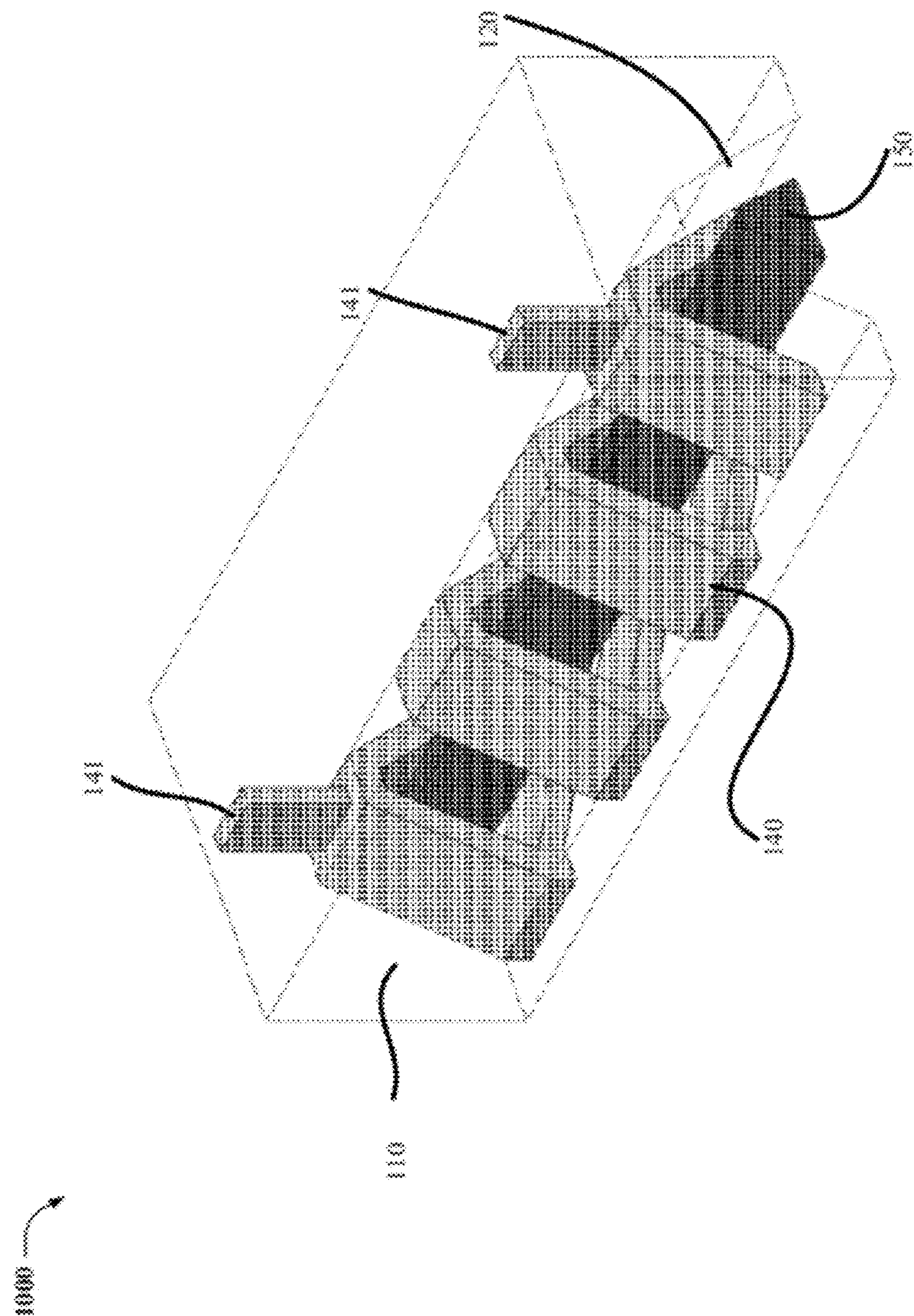
Figure 11:
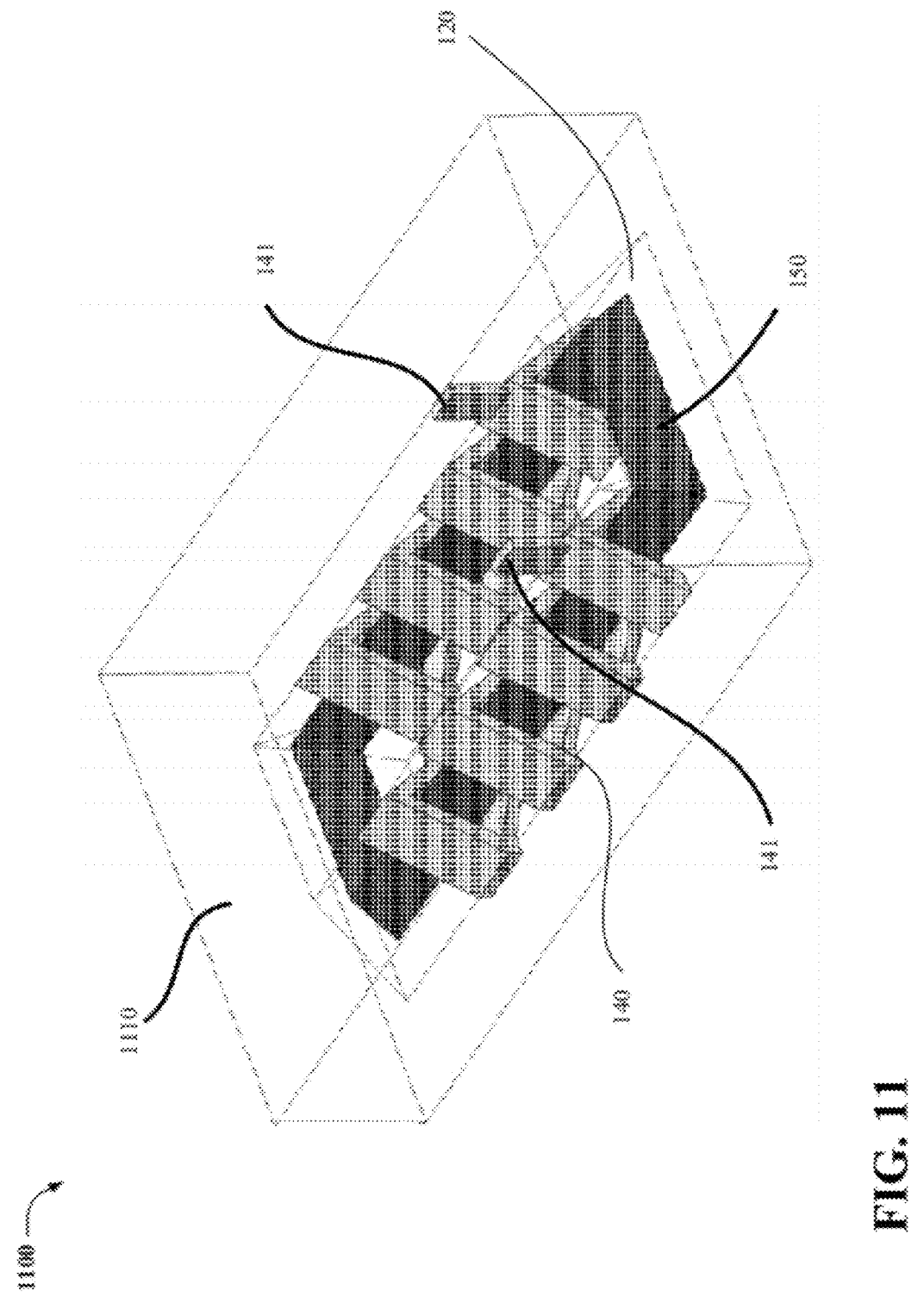

FIGS. 9-11 illustrate schematic 3-D views of respective magnetic induction devices, in accordance with various embodiments. For example, FIG. 9 illustrates a schematic 3-D view of an integrated magnetic induction device 900 having conductive vias 141 connected to respective conductive windings at a bottom layer of substrate 110. In another embodiment (not shown), magnetic induction device 900 can be fabricated in a top layer of substrate 110 without conductive vias.

In another embodiment illustrated by FIG. 10, V-groove 120 of magnetic induction device 1000 can have a trapezoidal cross section with a flat bottom, e.g., by forming V-groove 120 with insufficient etching time.

Figure 12:
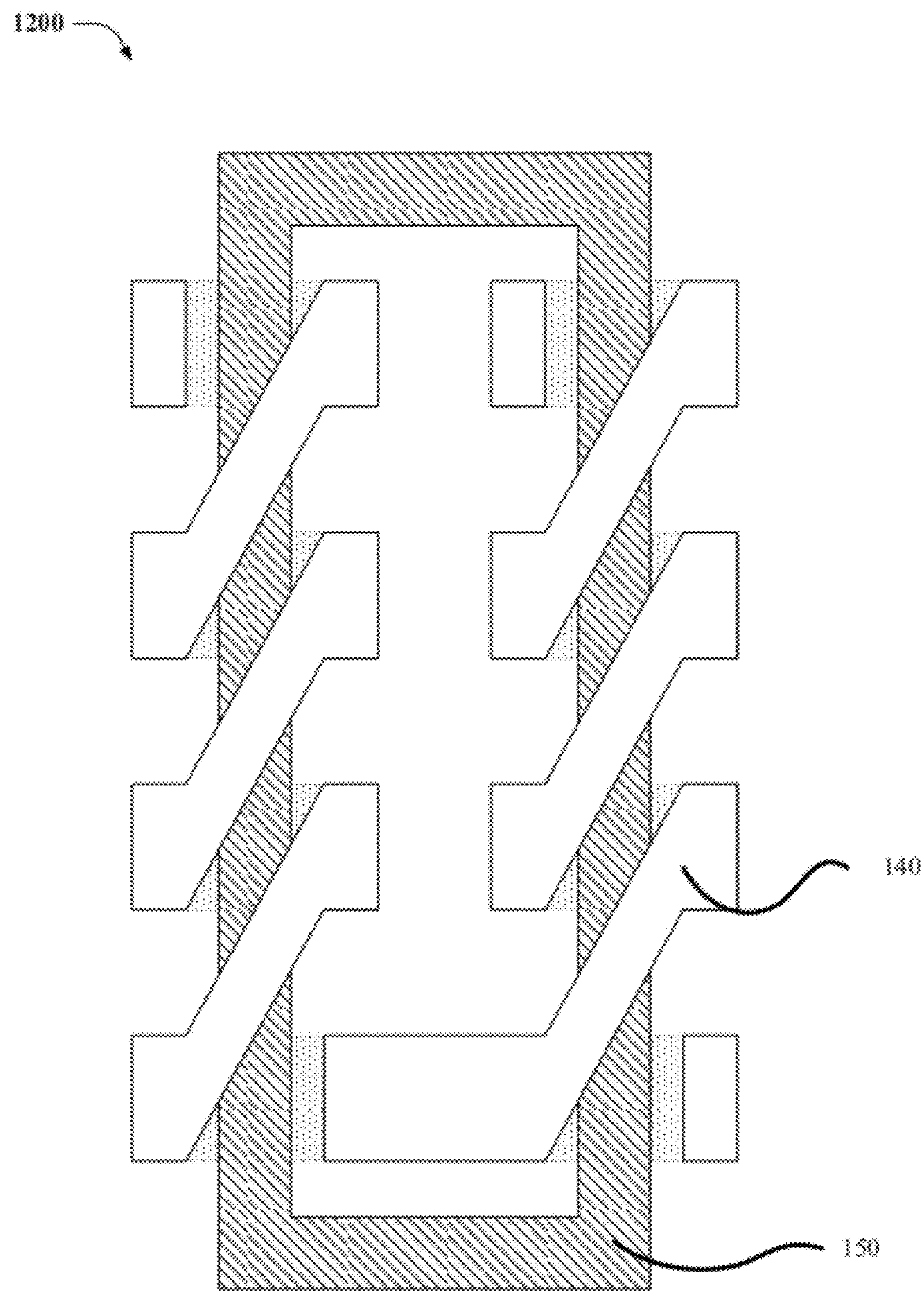
FIGS. 12-17 illustrate bottom views of respective magnetic induction devices, in accordance with various embodiments.

Referring now to FIGS. 11 and 12, a schematic 3-D view (1100) and bottom view (1200) of an inductor 1100 are illustrated, respectively, according various embodiments. Inductor 1100 can include groove 120 formed in substrate 1110. Further, inductor 1100 can include magnetic core 150 included in groove 120 and surrounded by conductive winding 140 that is adjacent to portion(s) of substrate 1110. Respective insulation layers (not shown) can be included between substrate 1110 and conductive winding 140, and between magnetic core 150 and conductive winding 140, for example, as described above with respect to insulation layers 230-232. Additionally, inductor 1100 can include conductive vias 141 formed in substrate 1110 and connected to respective portions of conductive winding 141.

As illustrated by FIG. 11, conductive vias 141 can be connected to conductive winding 140 towards an apex of groove 120. In another aspect (not shown), conductive vias 141 can be connected to conductive winding 140 towards a bottom portion of groove 120. Further, as illustrated by FIG. 12, magnetic core 150 can be a closed-loop magnetic core, e.g., formed in a rectangular shaped closed loop groove, with conductive winding 140 closely surrounding magnetic core 150.

Figure 13:
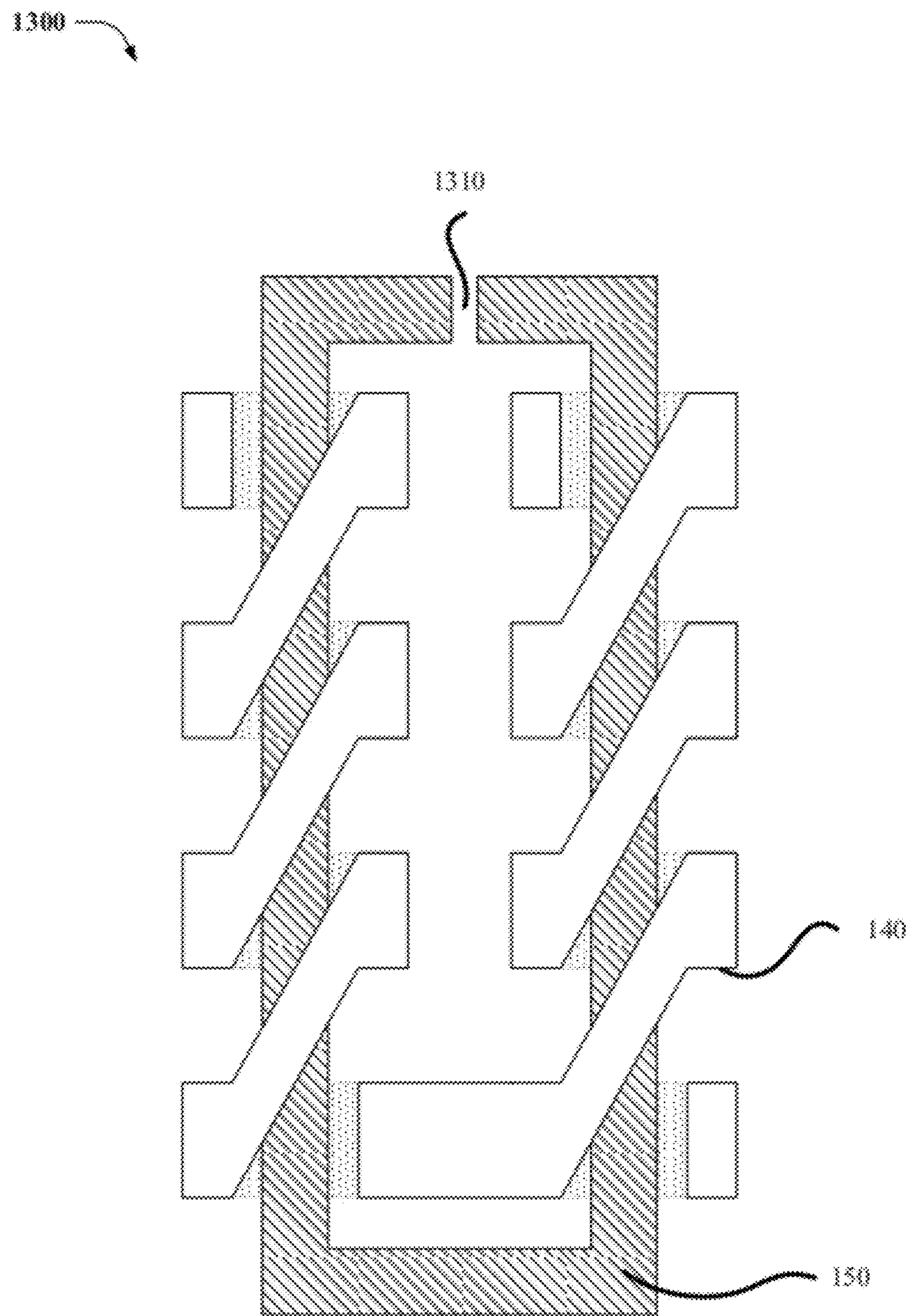
Figure 14:
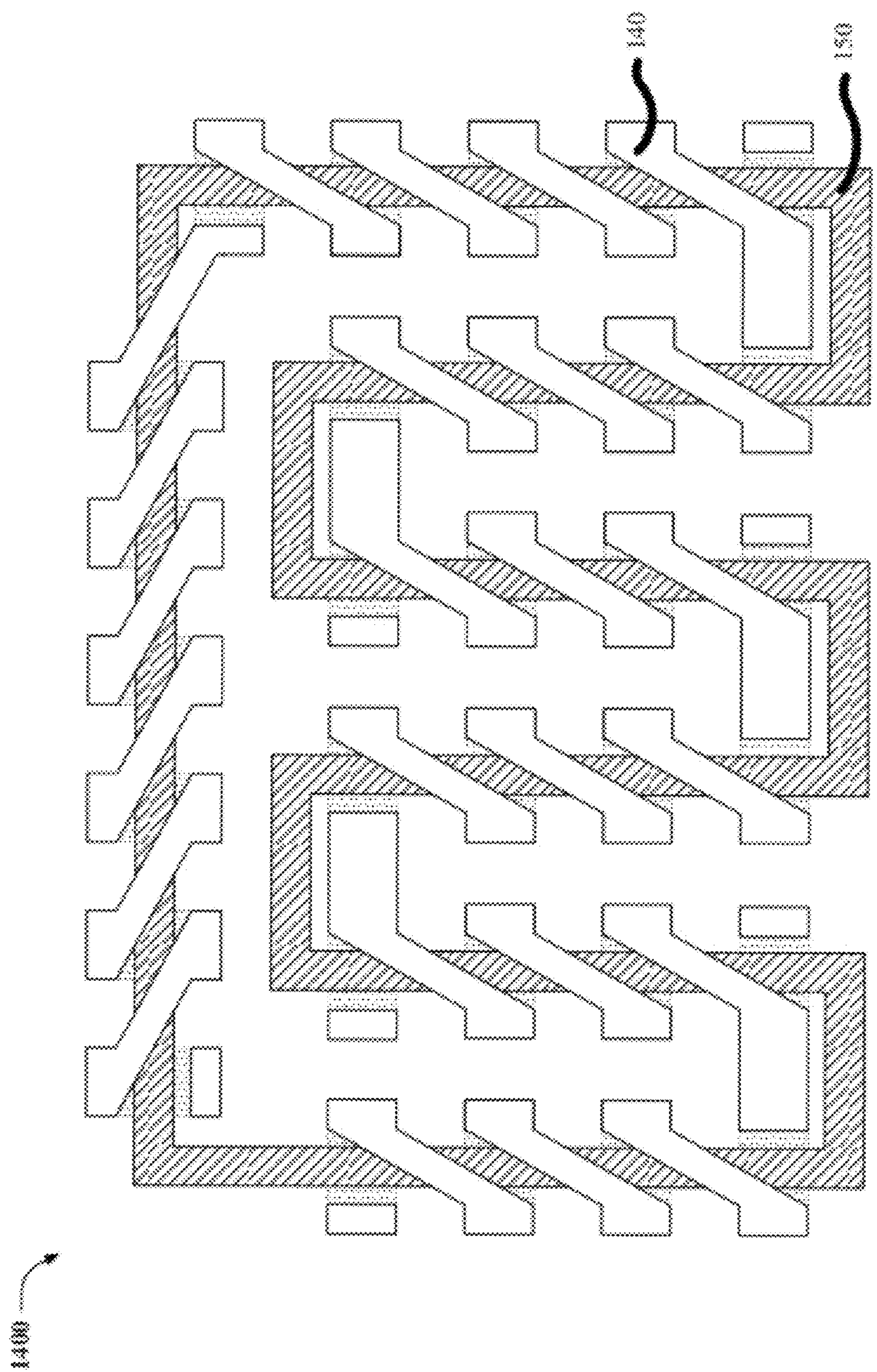

Now referring to FIGS. 13-17, bottom views of respective inductors/transformers 1300-1700 are illustrated, in accordance with various embodiments. As illustrated by FIG. 13, magnetic core 150 can include gap 1310 between respective ends of rectangular shaped magnetic core 150, forming an open-loop magnetic core. Further, as illustrated by FIG. 14, magnetic core 150 can include a segment formed across from other segments, e.g., as part of a meandering/roving pattern/shape closed-loop magnetic core in substrate 1100.

Figure 15:
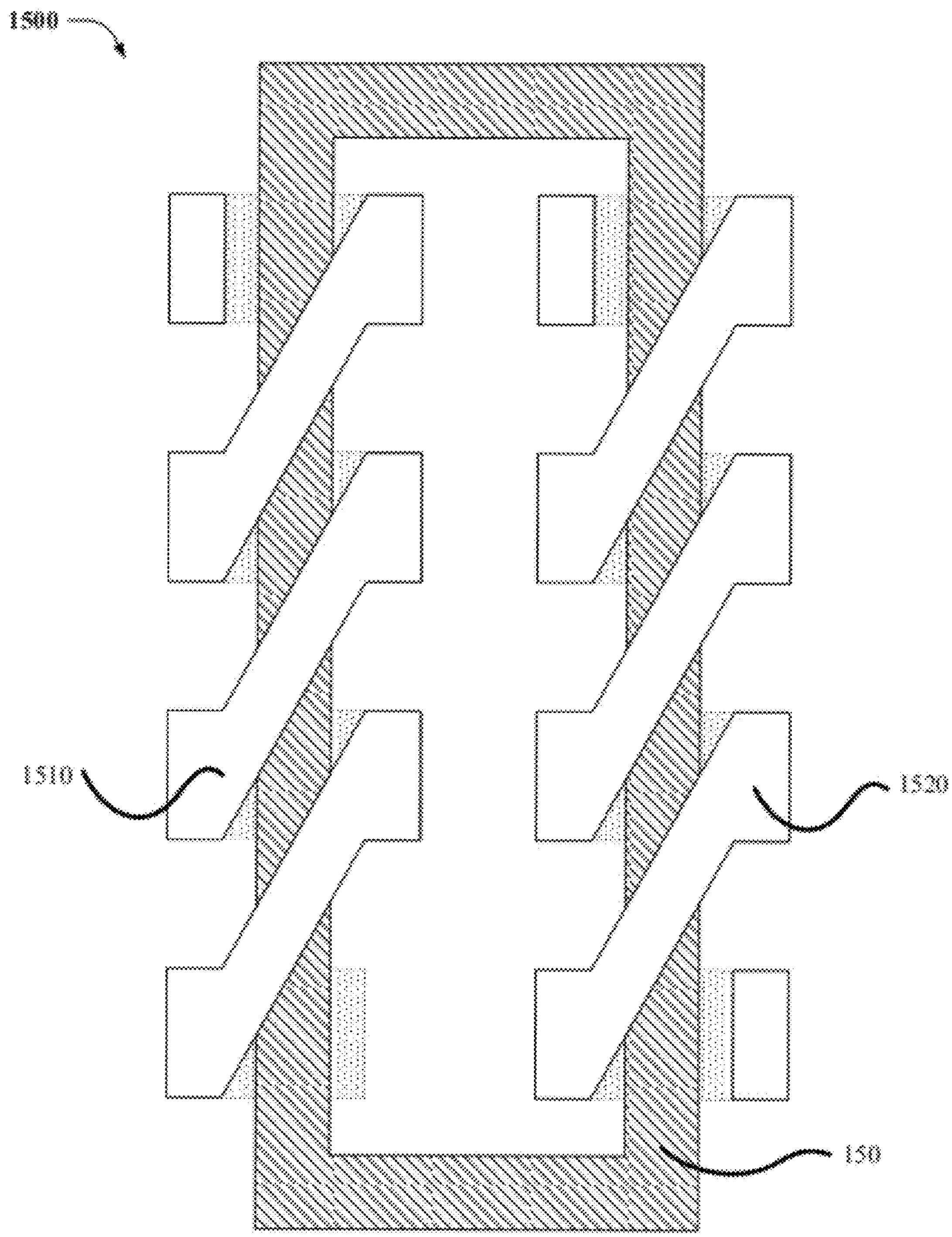
Figure 16:
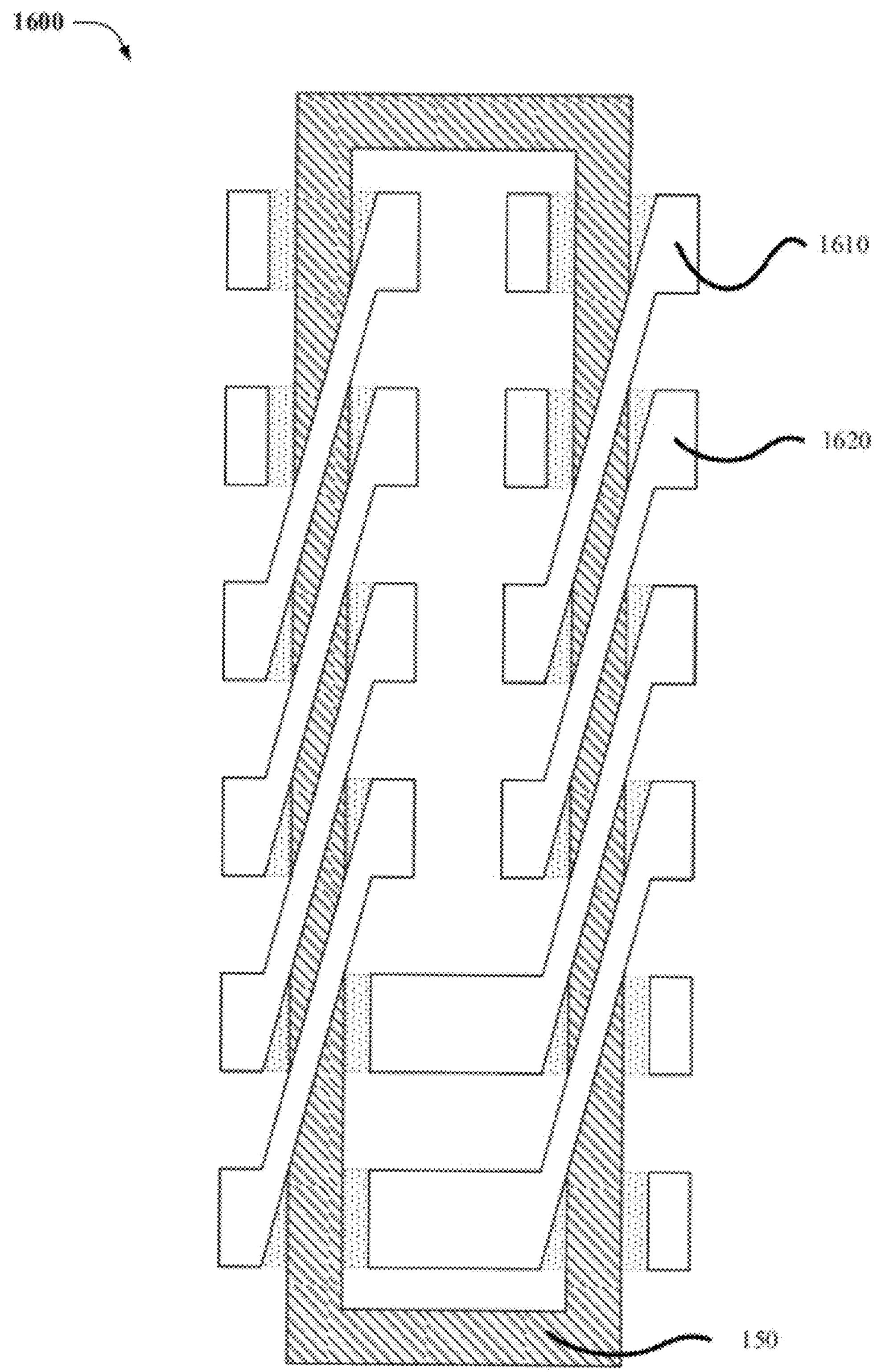

In embodiments disclosed herein, one or more conductive windings 141 can be formed, deposited, etc. in groove 120, etc. to surround magnetic core 150 to form various inductors and/or transformers. For example, as illustrated by FIG. 15, transformer 1500 can include a groove (not shown), e.g., 120, formed in a substrate, e.g., 1110. Further, transformer 1500 can include closed-loop magnetic core 150 included in the groove and surrounded by first conductive winding 1510 and second conductive winding 1520, which are adjacent to respective portions of the substrate. Furthermore, transformer 1500 can include respective insulation layers, e.g., 231, 232, etc. formed between the substrate and first conductive winding 1510, between the substrate and second conductive winding 1520, between closed-loop magnetic core 150 and first conductive winding 1510, and between closed-loop magnetic core 150 and second conductive winding 1520.

In another embodiment, transformer 1500 can include a first conductive via (not shown), e.g., 141, formed in the substrate and connected to portion(s) of first conductive winding 1510. Further, transformer 1500 can include a second conductive via (not shown), e.g., 141, formed in the substrate and connected to portion(s) of second conductive winding 1520. Referring now to transformer 1600 illustrated by FIG. 16, portion(s) of first conductive winding 1510 can be formed in separated and interleaved ways with portion(s) of second conductive winding 1520.

Figure 17:
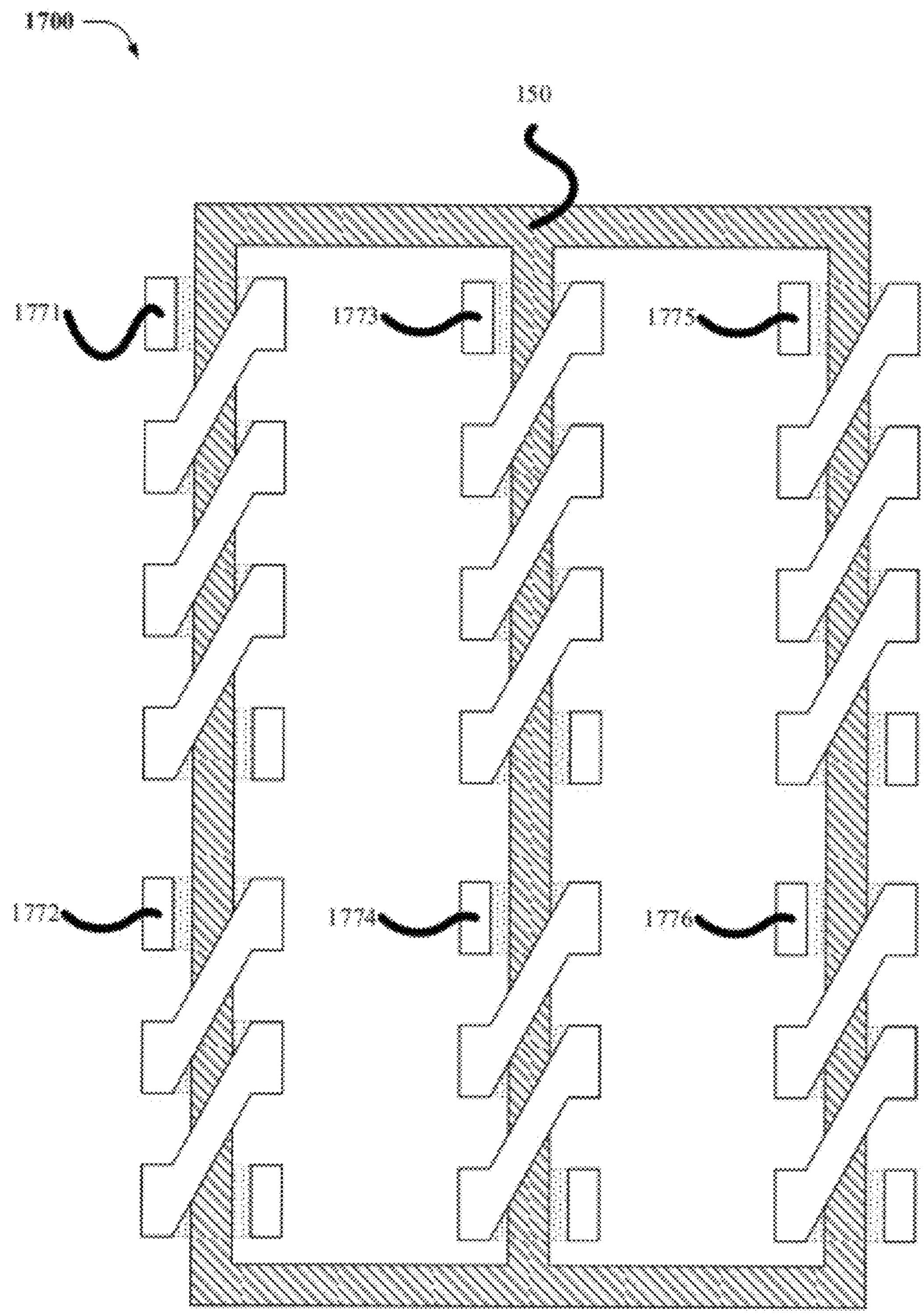

Referring now to FIG. 17, a bottom view of an integrated three-phase transformer 1700 is illustrated, according to an embodiment. Three sets of primary and secondary conductive windings (1) 1771 and 1772, (2) 1773 and 1774, and (3) 1775 and 1776 can be formed, deposited, etc. in groove 120, e.g., as described above regarding conductive winding 141, to surround three bars of magnetic core 150. In one embodiment, two terminals of each bar of the three bars can be connected via respective pairs of perpendicular bars of magnetic core 150.

For simplicity and clarity of illustration, some of the figures illustrate the general manner of construction of embodiments of semiconductor devices described herein. Further, description and details of well-known features and techniques of constructing such devices are omitted to avoid unnecessarily obscuring aspects of the innovation. Additionally, elements in the figures are not necessarily drawn to scale, and some regions or elements of the figures may be expanded to help improve understanding of embodiments of the invention.

The terms "first," "second," "third," "fourth," and the like may be used for distinguishing between similar elements and not necessarily for describing a particular sequential or chronological order. Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Figure 18:
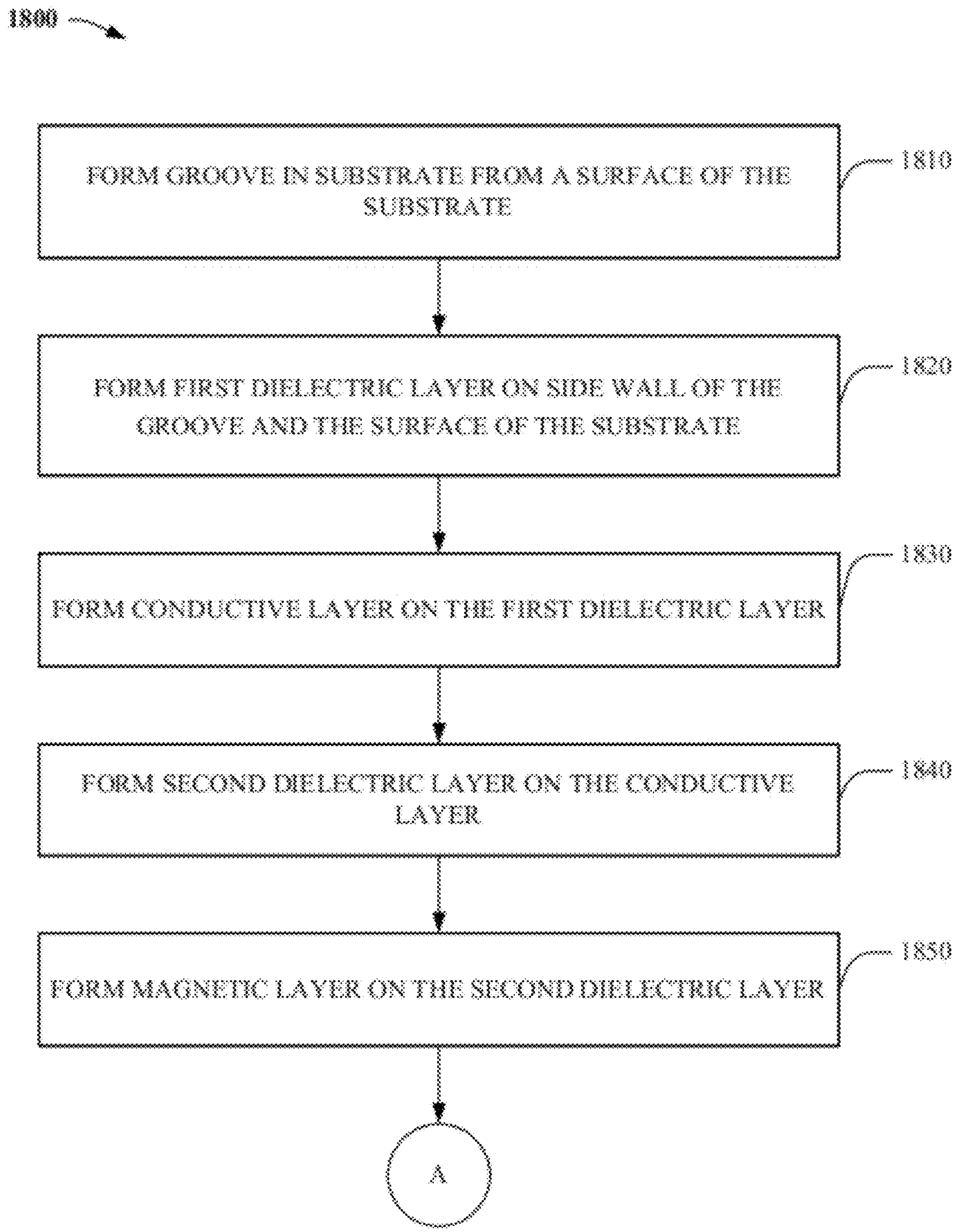
FIGS. 18-21 illustrate exemplary processes according to various embodiments.
Figure 19:
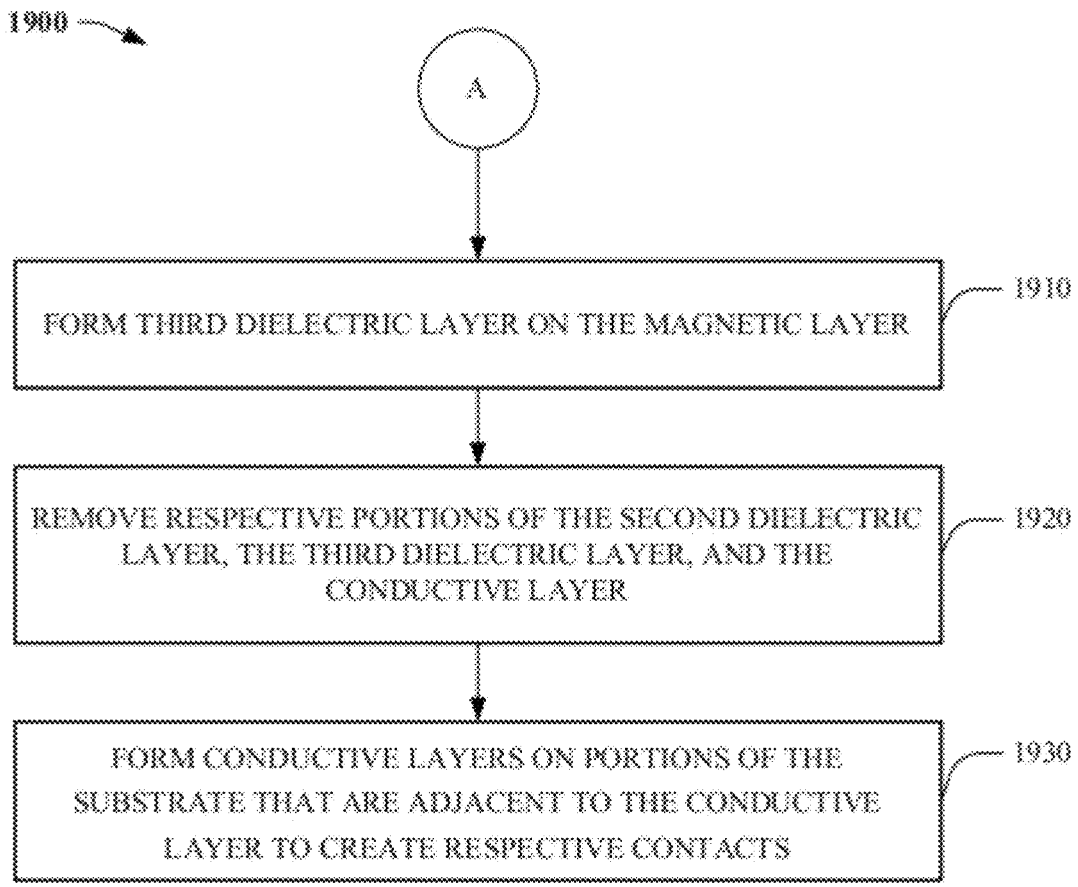
Figure 20:
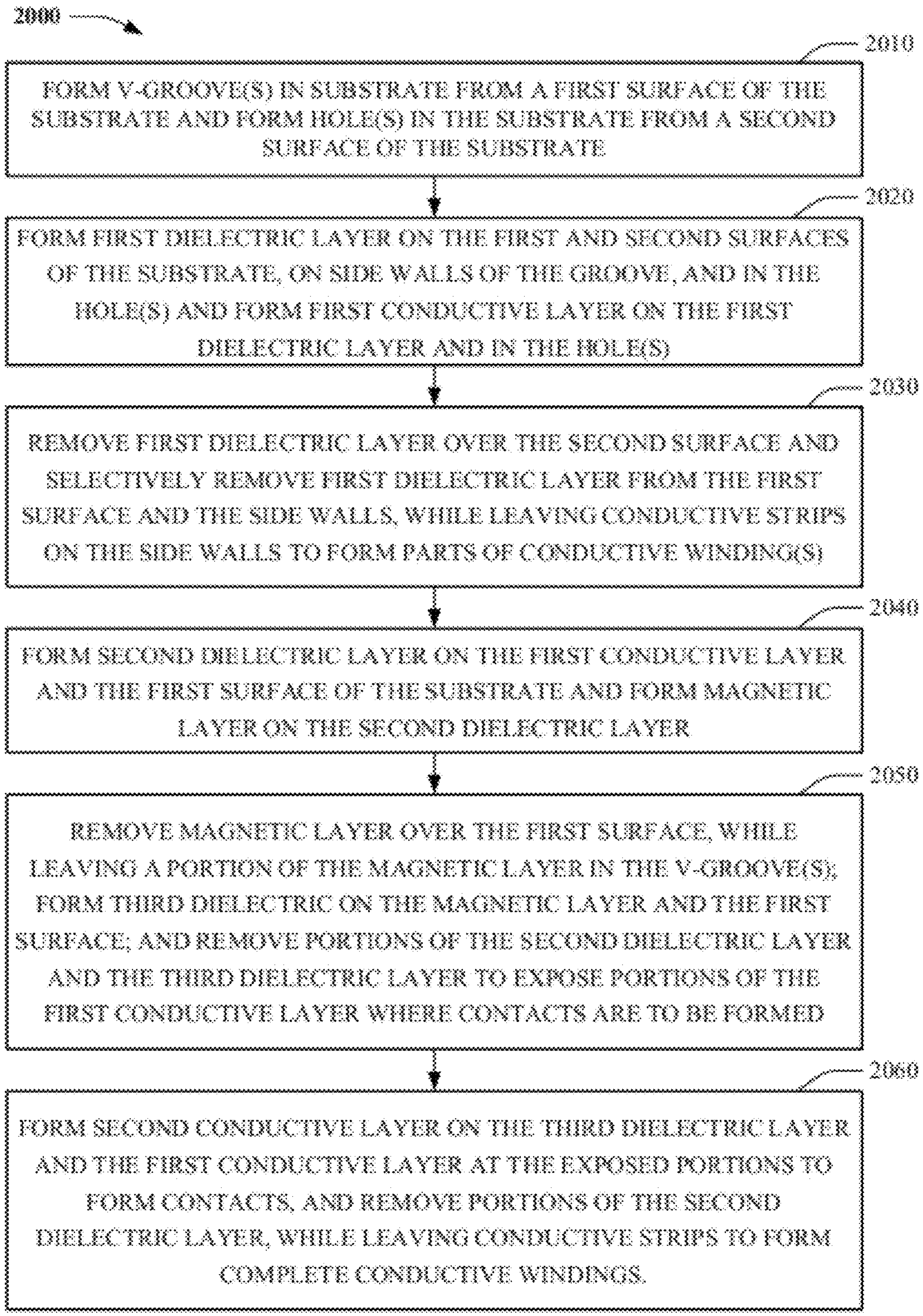

FIGS. 18-20 illustrate methodologies in accordance with the disclosed subject matter. For simplicity of explanation, the methodologies are depicted and described as a series of acts associated with respective blocks. It is to be understood and appreciated that the subject innovation is not limited by the acts illustrated and/or by the order of acts/blocks. For example, acts/blocks can occur in various orders and/or concurrently, and with other acts/blocks not presented or described herein. Furthermore, not all illustrated acts/blocks may be required to implement the methodologies in accordance with the disclosed subject matter. In addition, those skilled in the art will understand and appreciate that the methodologies could alternatively be represented as a series of interrelated states via a state diagram or events.

FIGS. 18-19 are flow diagrams illustrating an exemplary non-limiting embodiment for forming, fabricating, etc. a magnetic induction device. At 1810, a groove, e.g., 120, can be formed in a substrate, e.g., 110, from a first surface of the substrate. At 1820, a first dielectric layer, e.g., 430, can be formed on side wall(s) of the groove and the first surface of the substrate. At 1830, a conductive layer, e.g., 442, can be formed on the first dielectric layer. At 1840, a second dielectric layer, e.g., 631, can be formed on the conductive layer. At 1850, a magnetic layer, e.g., 650, can be formed on the second dielectric layer.

Continuing and now referring to FIG. 19, a third dielectric layer, e.g., 732, can be formed on the magnetic layer at 1910. At 1920, respective portions of the second dielectric layer, the third dielectric layer, and the conductive layer can be removed, e.g., by polishing, etching, etc. At 1930, conductive layers, e.g., 843, can be formed on portions of the substrate that are adjacent to the conductive layer to create respective contacts.

FIG. 20 illustrates another flow diagram illustrating an exemplary non-limiting embodiment for forming, fabricating, etc. a magnetic induction device. At 2010, V-groove(s) can be formed in a substrate from a first surface of the substrate, and hole(s) can be formed in the substrate from a second surface of the substrate. At 2020, a first dielectric layer can be formed on the first surface of the substrate, on the second surface of the substrate, on side walls of the V-groove(s), and in the hole(s). Further, a first conductive layer can be formed on the first dielectric layer and in the holes, e.g., completely filling up the hole(s). At 2030, the first conductive layer can be removed over the second surface of the substrate, e.g., utilizing a planarization process; and the first conductive layer can be selectively removed from the first surface of the substrate and the side walls of the V-groove(s), while leaving conductive strips on the side walls of the V-groove(s) to form respective parts of conductive winding(s), e.g., utilizing lithography and etching.

At 2040, a second dielectric layer can be formed on the first conductive layer and the first surface of the substrate. Further, a magnetic layer can be formed on the second dielectric layer, e.g., completely filling up the V-groove(s). In one aspect, the magnetic layer can be formed by deposition of a seed layer of conductive material, followed by electrochemical deposition of the magnetic material. In another aspect, the magnetic layer can be formed by chemical vapor deposition, sputtering, or any other deposition method.

At 2050, the magnetic layer over the first surface of the substrate can be removed, while leaving a portion of the magnetic layer in the V-groove(s), e.g., utilizing a planarization process. Further, a third dielectric layer can be formed on the magnetic layer and the first surface of the substrate. Furthermore, portions of the second dielectric layer and the third dielectric layer can be removed to expose portions of the first conductive layer where contacts are to be formed, e.g., utilizing lithography and etching. At 2060, a second conductive layer can be formed on the third dielectric layer and the first conductive layer at the exposed portions to make contacts. Further, portion(s) of the second dielectric layer can be removed, while leaving conductive strips to form complete conductive winding(s), e.g., utilizing lithography and etching.

In one embodiment, the V-groove(s) can be formed by crystal orientation dependent chemical etching of the substrate, or any other chemical etching or plasma etching methods with a lateral etching capability. In another embodiment, the hole(s) can be formed, e.g., forming conductive vias, by plasma etching. In yet another embodiment, the first dielectric layer, the second dielectric layer, and/or the third dielectric layer can be formed by chemical vapor deposition, sputtering, or any other deposition method. In one embodiment, such dielectric layers can be formed by thermal oxidation.

In another embodiment, the first conductive layer and/or the second conductive layer can be formed by deposition of a seed layer of conductive material, followed by electrochemical deposition. In one aspect, the first conductive layer and/or the second conductive layer can be formed by chemical vapor deposition, sputtering, or any other deposition method.

Figure 21:
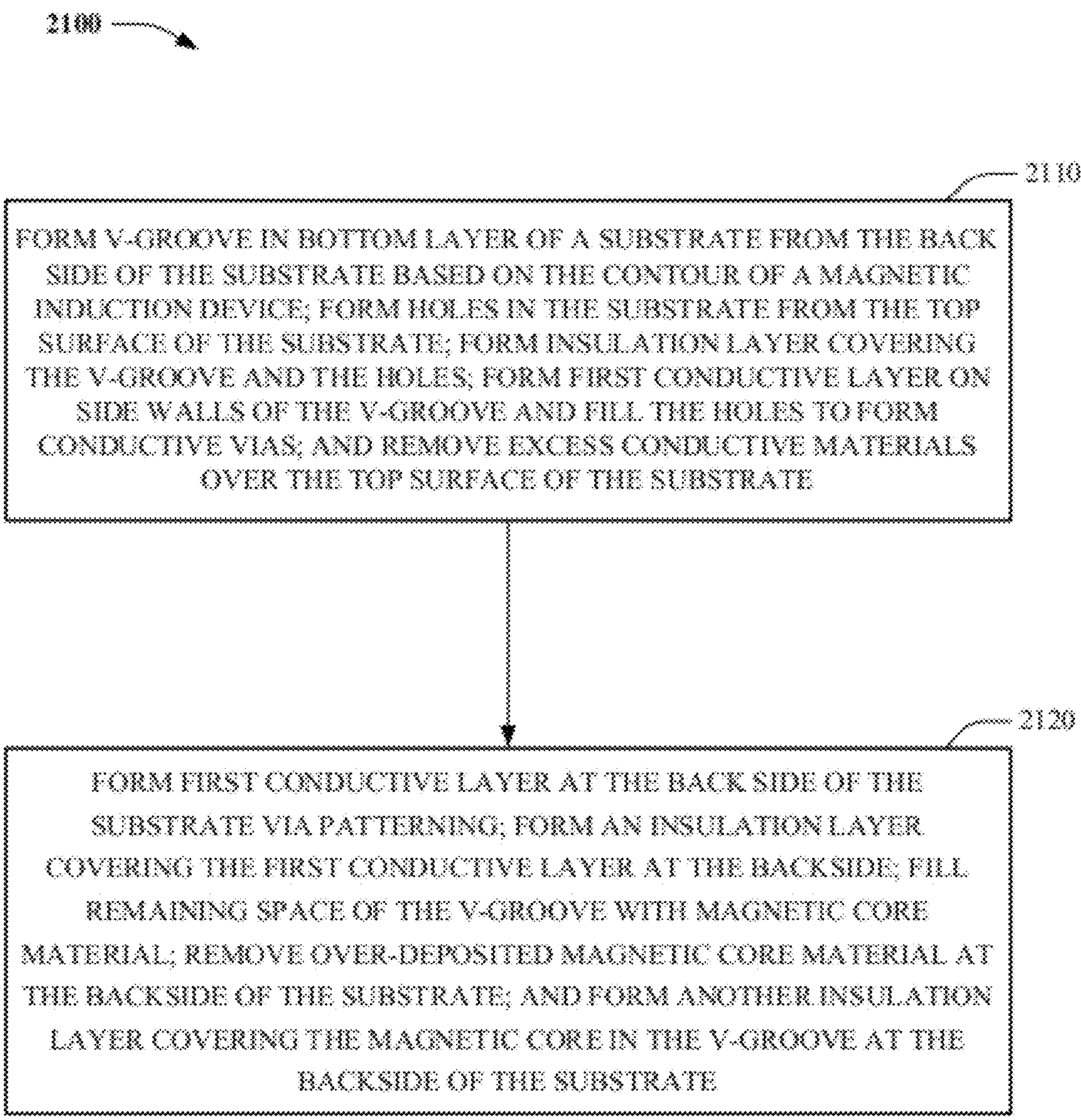

FIG. 21 illustrates yet another flow diagram illustrating an exemplary non-limiting embodiment for forming, fabricating, etc. a magnetic induction device. At 2110, a V-groove can be formed in the bottom layer of the substrate from the back side of the substrate based on the contour of the magnetic induction device; holes can be formed in the substrate from the top surface of the substrate; an insulation layer can be formed that covers the V-groove and the holes; a first conductive layer can be formed on side walls of the V-groove and fill the holes to form conductive vias; and excess conductive materials can be removed over the top surface of the substrate.

At 2120, the first conductive layer can be formed, applied, etc. at the back side of the substrate via patterning; an insulation layer that covers the first conductive layer can be formed at the backside of the substrate; remaining space of the V-groove can be filled with magnetic core material; over-deposited magnetic core material can be removed at the backside of the substrate; and an other insulation layer that covers the magnetic core in the V-groove can be formed at the backside of the substrate. In an embodiment, the other insulation layer can be formed, applied, etc. at the backside of the substrate to expose the first conductive layer at necessary locations for contacts utilizing patterning. Further, a second conductive layer can be formed at the backside of the substrate, e.g., utilizing patterning.

In one or more other embodiments, the magnetic induction device can be fabricated at the front side of the substrate. In such embodiments, for example, holes can alternatively be formed in the substrate from the bottom surface of the substrate, and excess conductive materials can alternatively be removed over the bottom surface of the substrate.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" or "at least one" unless specified otherwise or clear from context to be directed to a singular form. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

The words "example" or "exemplary" are used herein to mean serving as an example, instance, or illustration. Any aspect or design described herein as "exemplary" is not necessarily to be construed as preferred or advantageous over other aspects or designs, nor is it meant to preclude equivalent exemplary structures and techniques known to those of ordinary skill in the art. Rather, use of the word exemplary is intended to present concepts in a concrete fashion. For the avoidance of doubt, the subject matter of the various different embodiments disclosed herein are not limited by such examples.

Some of the aforementioned embodiments have been described with respect to interaction between several components, circuit components, etc. that are, e.g., included in an SOC system. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it is to be noted that one or more components may be combined into a single component providing aggregate functionality or divided into several separate sub-components, and that any one or more middle layers or components, may be provided to couple to such sub-components in order to provide integrated functionality. Any components described herein may also interact with one or more other components not specifically described herein but generally known by those of skill in the art.

In view of the exemplary components and systems described supra, methodologies that may be implemented in accordance with the described subject matter will be better appreciated with reference to the flowcharts of the various figures. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated blocks may be required to implement the methodologies described hereinafter.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A magnetic induction device, comprising:

a semiconductor substrate comprising a front surface for placement of integrated circuit devices;

a groove formed at a back surface of the semiconductor substrate, wherein the back surface is opposite to the front surface;

a magnetic core formed in the groove;

a conductive winding that surrounds the magnetic core within the groove formed in the semiconductor substrate;

a conductive via that is formed in the semiconductor substrate above an apex of the groove and is connected to the conductive winding at the apex of the groove; and respective insulation layers included between the semiconductor substrate and the conductive winding and between the magnetic core and the conductive winding.

2. The magnetic induction device of claim 1, wherein the conductive via is connected to the front surface of the semiconductor substrate and an insulation layer included between the semiconductor substrate and the conductive via.

3. The magnetic induction device of claim 1, wherein the conductive via is connected to a conductive layer at the front surface of the semiconductor substrate above the apex of the groove.

4. The magnetic induction device of claim 2, wherein the respective insulation layers include the insulation layer included between the semiconductor substrate and the conductive via.

5. The magnetic induction device of claim 1, wherein a first insulation layer of the respective insulation layers includes a first dielectric layer formed on a side wall of the groove.

6. The magnetic induction device of claim 5, wherein the conductive winding includes a conductive layer formed on the first dielectric layer.

7. The magnetic induction device of claim 6, wherein the conductive layer includes a patterned conductive layer.

8. The magnetic induction device of claim 6, wherein a second insulation layer of the respective insulation layers includes a second dielectric layer formed on the conductive layer.

9. The magnetic induction device of claim 8, wherein the magnetic core includes a magnetic layer formed on the second dielectric layer.

10. The magnetic induction device of claim 9, further comprising a third dielectric layer formed on the magnetic layer.

11. The magnetic induction device of claim 10, further comprising another conductive layer contacting the conductive layer and the third dielectric layer, wherein the other conductive layer comprises a patterned conductive layer.

12. The magnetic induction device of claim 2, wherein the conductive via is connected to a conductive layer that is connected to the conductive winding at a base of the groove.

13. The magnetic induction device of claim 1, wherein the groove includes a trapezoidal or v-shaped cross section.

14. An inductor, comprising:

a semiconductor substrate comprising a front side for placement of integrated circuit devices;

a groove formed at a back side of the semiconductor substrate, wherein the back side is opposite to the front side;

a magnetic core formed in the groove;

a conductive winding that surrounds the magnetic core within the groove formed in the semiconductor substrate;

respective insulation layers included between the semiconductor substrate and the conductive winding and between the magnetic core and the conductive winding; and a conductive via that is formed in the semiconductor substrate above an apex of the groove, connected to the conductive winding at the apex of the groove, and connected to the front side of the semiconductor substrate above the apex of the groove.

15. The inductor of claim 14, wherein the conductive via is connected to the conductive winding towards a bottom portion of the groove.

16. The inductor of claim 14, wherein the magnetic core is a closed-loop magnetic core.

17. The inductor of claim 14, wherein the magnetic core includes a gap between respective ends of the magnetic core.

18. The inductor of claim 14, wherein the magnetic core includes a segment that is formed across from other segments of the magnetic core.

19. A transformer, comprising:

a semiconductor substrate comprising a top surface for placement of integrated circuit devices;

a groove formed from a bottom surface of the semiconductor substrate that is opposite to the top surface;

a closed-loop magnetic core formed in the groove;

a conductive winding that surrounds the closed-loop magnetic core within the groove formed in the semiconductor substrate;

respective insulation layers formed between the semiconductor substrate and the conductive winding and between the closed-loop magnetic core and the conductive winding; and a first conductive via formed in the semiconductor substrate above an apex of the groove and connected to at least a portion of the conductive winding at the apex of the groove.

20. The transformer of claim 19, further comprising:

a second conductive via formed in the semiconductor substrate and connected to at least a portion of another conductive winding that surrounds the closed-loop magnetic core within the groove formed in the semiconductor substrate.

21. The transformer of claim 19, further comprising another conductive winding that surrounds the closed-loop magnetic within the groove formed in the semiconductor substrate, wherein at least a portion of the conductive winding is interleaved with at least a portion of the other conductive winding that is electrically isolated from the portion of the conductive winding.

22. The transformer of claim 19, further comprising:

another conductive winding that is adjacent to a portion of the semiconductor substrate and electrically isolated from the portion of the conductive winding; and other respective insulation layers formed between the semiconductor substrate and the other conductive winding and between the closed-loop magnetic core and the other conductive winding.

23. The magnetic induction device of claim 1, further comprising an integrated circuit device attached to the front surface.

24. The transformer of claim 19, wherein the first conductive via is connected to the top surface above the apex of the groove.

* * * * *